(12) United States Patent
Price et al.

(10) Patent No.: US 11,293,970 B2
(45) Date of Patent: Apr. 5, 2022

(54) ADVANCED IN-LINE PART AVERAGE TESTING

(71) Applicant: KLA Corporation, Milpitas, CA (US)

(72) Inventors: David W. Price, Austin, TX (US); Robert J. Rathert, Mechanicsville, VA (US); Kara L. Sherman, Milpitas, CA (US); John Charles Robinson, Austin, TX (US); Mike Von Den Hoff, Munich (DE); Barry Saville, Gansevoort (GB); Robert Cappel, Milpitas, CA (US); Oreste Donzella, San Ramon, CA (US); Naema Bhatti, Milpitas, CA (US); Thomas Groos, Mengerskirchen (DE); Teng-Song Lim, Singapore (SG); Doug Sutherland, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/101,856

(22) Filed: Nov. 23, 2020

(65) Prior Publication Data
US 2021/0215753 A1 Jul. 15, 2021

Related U.S. Application Data

(60) Provisional application No. 62/959,984, filed on Jan. 12, 2020.

(51) Int. Cl.
*G01R 31/28* (2006.01)
(52) U.S. Cl.
CPC ............................... *G01R 31/2837* (2013.01)
(58) Field of Classification Search
CPC .................. G01R 31/2837; G01R 31/2831
See application file for complete search history.

(56) References Cited

U.S. PATENT DOCUMENTS 7,023,230 B1 * 4/2006 Allen, III ........... G01R 31/3008
324/73.1
7,441,168 B2 * 10/2008 Yoshida ........... G01R 31/31835
714/724

(Continued)

FOREIGN PATENT DOCUMENTS

JP 5022174 B2 9/2012

OTHER PUBLICATIONS

Price, D.W. et al., "Inline Defect Part Average Testing" 2018 AEC Reliability Workshop. Apr. 25, 2018, Detroit, MI, 23 pages.

(Continued)

*Primary Examiner* — Manuel A Rivera Vargas
*Assistant Examiner* — Yaritza H Perez Bermudez
(74) *Attorney, Agent, or Firm* — Suiter Swantz pc llo

(57) ABSTRACT

An inspection system may include a controller communicatively coupled to one or more in-line sample analysis tools including, but not limited to, an inspection tool or a metrology tool. The controller may identify defects in a population of dies based on data received from at least one of the one or more in-line sample analysis tools, assign weights to the identified defects indicative of predicted impact of the identified defects on reliability of the dies using a weighted defectivity model, generate defectivity scores for the dies in the population by aggregating the weighted defects in the respective dies in the population, and determine a set of outlier dies based on the defectivity scores for the dies in the population, wherein at least some of the set of outlier dies are isolated from the population.

31 Claims, 16 Drawing Sheets

(56) References Cited

U.S. PATENT DOCUMENTS

| | | | |
|---|---|---|---|
| 8,042,073 B1* | 10/2011 | Nnaji | G01R 31/3008 716/101 |
| 10,761,128 B2 | 9/2020 | Price et al. | |
| 2001/0023083 A1* | 9/2001 | Simmons | H01L 22/20 438/14 |
| 2002/0032888 A1* | 3/2002 | Ott | H01L 22/20 714/724 |
| 2004/0133833 A1* | 7/2004 | Nozuyama | G01R 31/318342 714/738 |
| 2005/0055121 A1* | 3/2005 | Wang | G05B 23/0221 700/110 |
| 2005/0114065 A1* | 5/2005 | Nozuyama | G01R 31/3008 702/117 |
| 2006/0265684 A1* | 11/2006 | Buehler | G06F 30/394 716/112 |
| 2006/0267577 A1* | 11/2006 | Erez | G01R 31/2894 324/750.15 |
| 2008/0270088 A1* | 10/2008 | Abe | G05B 17/02 703/2 |
| 2009/0210764 A1* | 8/2009 | Nozuyama | G01R 31/318314 714/737 |
| 2010/0077364 A1* | 3/2010 | Riviere-Cazeaux | G06F 30/398 716/136 |
| 2013/0057311 A1* | 3/2013 | Sakaguchi | G01R 31/31718 324/759.03 |
| 2014/0168418 A1* | 6/2014 | Hess | G06T 7/001 348/126 |
| 2014/0301630 A1* | 10/2014 | Kulkarni | G06T 7/0004 382/149 |
| 2015/0051859 A1* | 2/2015 | Chien | H01L 22/20 702/81 |
| 2015/0154746 A1* | 6/2015 | Zafar | G06T 7/0006 382/149 |
| 2016/0314578 A1* | 10/2016 | Banerjee | G06T 7/001 |
| 2018/0238816 A1* | 8/2018 | Sousa | G01N 21/95607 |
| 2018/0275189 A1* | 9/2018 | Price | G07C 3/14 |
| 2019/0295908 A1* | 9/2019 | Rathert | G01R 31/2831 |

OTHER PUBLICATIONS

Automotive Electronics Council: AEC-Q001-Rev D, http://www.aecouncil.com/Documents/AEC_Q001_Rev_D.pdf, Dec. 9, 2011, 12 pages.

Bruneel, G. et al., "Implementation of I-PAT™ High Speed Inline Defect Screening", Second European Automotive Electronics Council Reliability Workshop, Oct. 15, 2019, 26 pages.

Anilturk, Onder et al., "Inline Part Average Testing (I-PAT™) to Reduce Escapes from both Gaps in Test and Latent Reliability Defects: Continuing Feasibility Study Results at NXP", Second European Automotive Electronics Council Reliability Workshop, Oct. 15, 2019.

PCT International Search Report and Written Opinion for International Application No. PCT/US2021/012875 dated May 10, 2021, 6 pages.

* cited by examiner

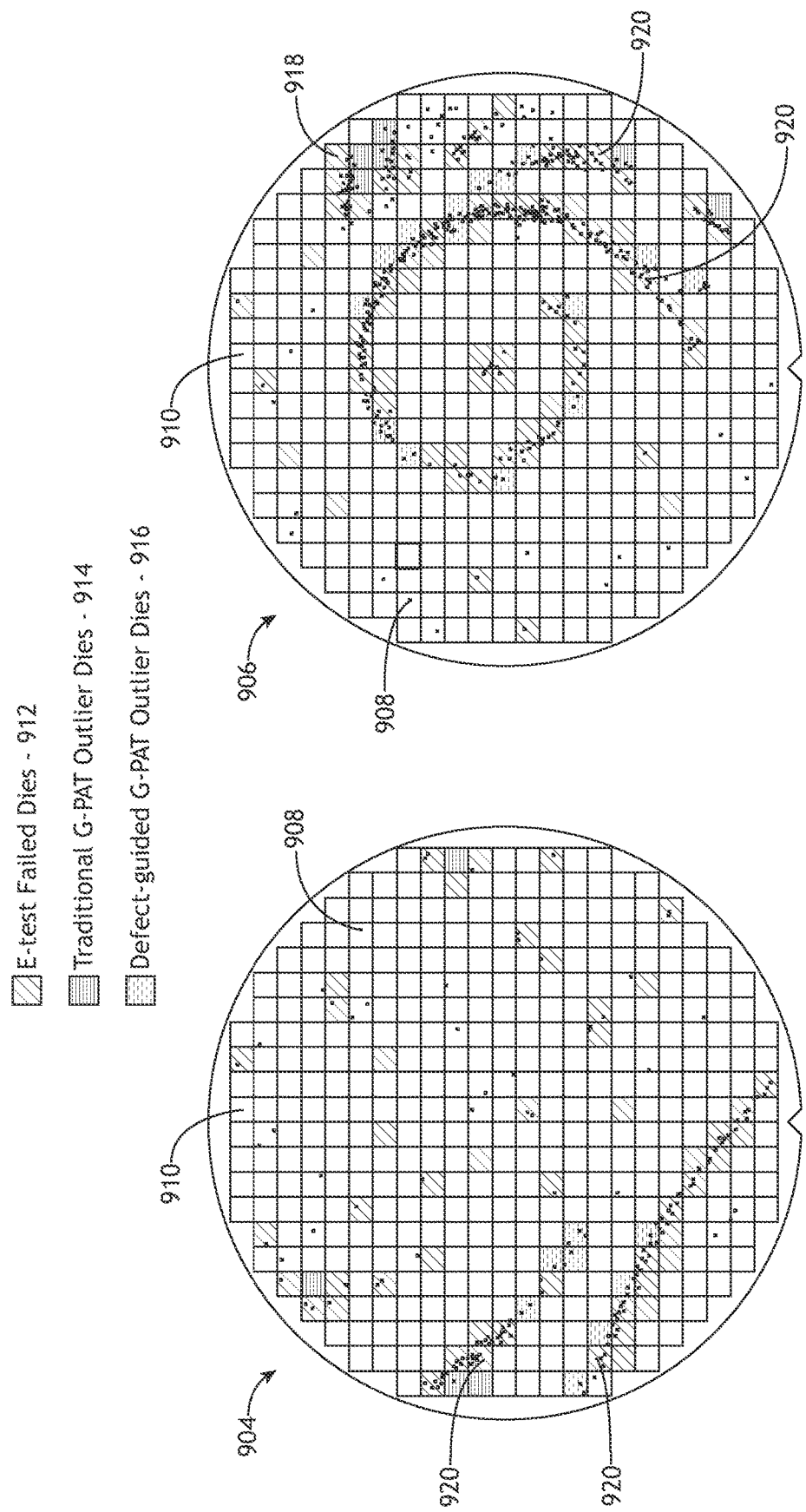

ADVANCED IN-LINE PART AVERAGE TESTING

CROSS-REFERENCE TO RELATED APPLICATION

The present application claims the benefit under 35 U.S.C. § 119(e) of U.S. Provisional Application Ser. No. 62/959,984 filed on Jan. 12, 2020, which is incorporated herein by reference in the entirety.

TECHNICAL FIELD

The present disclosure relates generally to process control and, more particularly, to defect inspection and reliability control in semiconductor device fabrication processes.

BACKGROUND

Fabrication of semiconductor devices may typically require hundreds of processing steps to form a functioning device. Over the course of these processing steps, various inspection and/or metrology measurements may be performed to identify defects and/or monitor various parameters on the devices. Electrical testing may also be performed to verify or assess the functionality of the device. However, while some detected defects and metrology errors may be so significant as to clearly indicate a device failure, lesser variations may cause early reliability failures of the device after exposure to their working environment. Risk averse users of semiconductor devices, such as automotive, military, aeronautical and medical applications, may require failure rates in the parts per billion (PPB) range, well below current levels. Recognizing and controlling reliability defects is key to meeting these industry requirements. Therefore, it may be desirable to provide systems and methods for reliability defect detection.

SUMMARY

An inspection system is disclosed in accordance with one or more illustrative embodiments of the present disclosure. In one illustrative embodiment, the system includes a controller communicatively coupled to one or more in-line sample analysis tools. In another illustrative embodiment, the controller identifies defects in a population of dies based on data received from the at least one of the one or more in-line sample analysis tools. In another illustrative embodiment, the controller assigns weights to the identified defects using a weighted defectivity model, where the weighted defectivity model assigns weights to the identified defects indicative of predicted impact of the identified defects on reliability of the dies. In another illustrative embodiment, the controller generates defectivity scores for the dies in the population by aggregating the weighted defects in the respective dies in the population. In another illustrative embodiment, the controller determines a set of outlier dies based on the defectivity scores for the dies in the population, wherein at least some of the set of outlier dies are isolated from the population.

An inspection method is disclosed in accordance with one or more illustrative embodiments of the present disclosure. In one illustrative embodiment, the method includes identifying defects in a population of dies based on inspection data received from one or more in-line sample analysis tools. In another illustrative embodiment, the method includes assigning weights to the identified defects using a weighted defectivity model, where the weighted defectivity model assigns weights to the identified defects indicative of predicted impact of the identified defects on reliability of the dies. In another illustrative embodiment, the method includes generating defectivity scores for the dies in the population by aggregating the weighted defects in the respective dies in the population. In another illustrative embodiment, the method includes determining a set of outlier dies based on the defectivity scores for the dies in the population, wherein at least some of the set of outlier dies are isolated from the population.

An inspection system is disclosed in accordance with one or more illustrative embodiments of the present disclosure. In one illustrative embodiment, the system includes a controller communicatively coupled to one or more in-line sample analysis tools. In another illustrative embodiment, the controller identifies defects in a population of dies based on inspection data received from the one or more in-line sample analysis tools. In another illustrative embodiment, the controller identifies two or more sets of candidate outlier dies in the population using two or more weighted defectivity models, where identifying a particular set of candidate outlier dies using a particular weighted defectivity model of the two or more weighted defectivity models comprises assigning weights to the identified defects indicative of predicted impact of the identified defects on reliability of the dies using the particular weighted defectivity model, generating defectivity scores for the dies in the population by aggregating the weighted defects in the respective dies in the population, and determining a particular set of candidate outlier dies based on the defectivity scores for the dies in the population. In another illustrative embodiment, the controller determines an output set of outlier dies based on the two or more sets of candidate outlier dies, wherein at least some of the output set of outlier dies are isolated from the population.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIGS. 9A-9C illustrate three experimental implementations of defect-guided G-PAT methodologies on three example dies, in accordance with one or more embodiments of the present disclosure.

DETAILED DESCRIPTION

Figure 1:
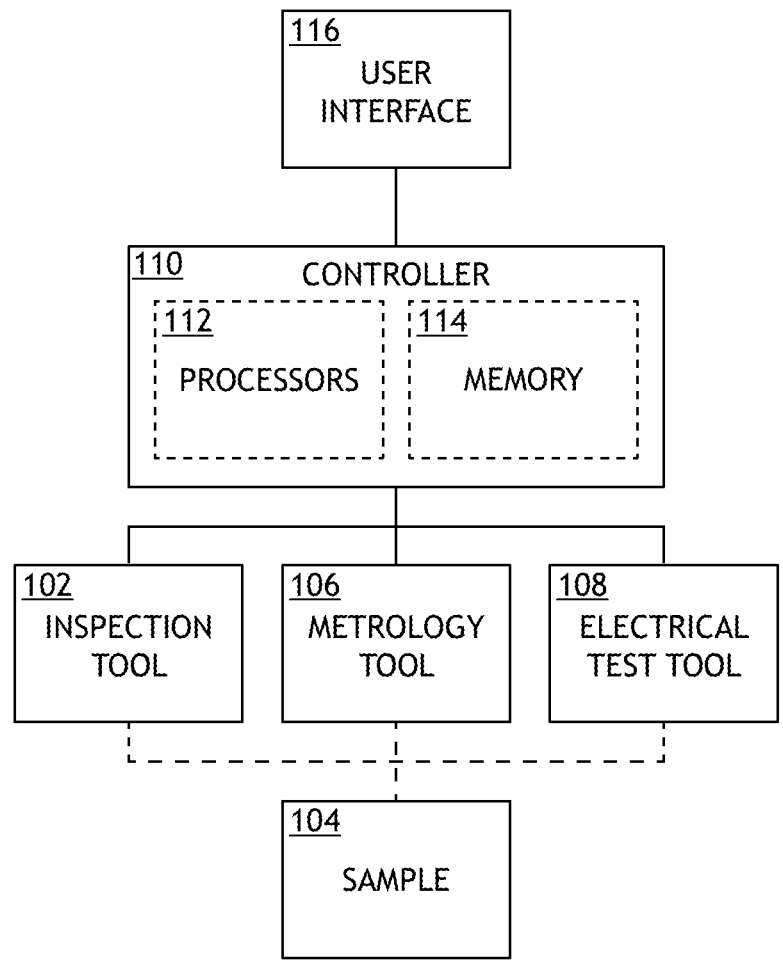
FIG. 1 is a block diagram view of a reliability control system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods using advanced in-line part average testing (I-PAT) for the detection of defects that may lead to immediate or early-life reliability failures in manufactured devices such as, but not limited to, semiconductor devices.

Defects arising during the manufacturing process may have a wide range of impacts on the performance of the device in the field. For example, "killer" defects may result in immediate device failure, whereas many minor defects may have little or no impact on the performance of the device throughout the device lifetime. However, there may be a class of defects, referred to herein as reliability defects or latent defects, that may not lead to immediate device failure, but may lead to early-life failure of the device when used in a working environment.

Various strategies may be utilized to monitor or control the reliability of devices entering a supply or distribution chain. For example, electrical testing of dies is commonly performed to evaluate the functioning of one or more aspects of the die as data for reliability analysis. This electrical testing may be performed at any point in the manufacturing process and may include, but is not limited to, a pre burn-in electrical wafer sort and final test (e.g., an e-test) or a post burn-in electrical test. Devices that fail an electrical testing step may be "inked off" and isolated from the remaining devices in the population. For example, the dies may be removed from the supply chain (e.g., discarded) or flagged for further testing.

However, it is contemplated herein that electrical testing alone may not provide sufficient information to meet stringent reliability standards while maintaining cost and throughput targets. For example, a post burn-in electrical test may provide an accurate analysis of the functioning of a die since the die is in a near-final state, but may not be practical in high volumes due to cost, time requirements, or the potential for introducing long-term reliability problems. Further, electrical testing during any step of production generally only provides pass/fail information suitable for identifying devices already exhibiting full or partial failures, but may not be suitable identifying devices that may fail at a later time (e.g., devices having latent defects). By way of another example, it is often impractical or sometimes impossible to fully characterize each die using electrical testing, resulting in gaps in the electrical testing. For instance, there may exist theoretically-possible defects in a particular circuit layout that may not be detectable using electrical testing even with a "perfect" testing strategy.

Further, it may not be cost-effective or practical to fully characterize all aspects of each die such that a selected testing strategy may deviate from an otherwise "perfect" or otherwise optimized testing strategy. For instance, imperfect test coverage may result from, but is not limited to, untestable areas of a particular circuit, analog circuits that may be difficult to test (e.g., high-voltage analog circuits), or circuits that would require complex simultaneous or sequential energizing of multiple portions. For the purposes of the present disclosure, the term "test coverage" is used to broadly describe metrics used to evaluate the performance of a testing strategy.

Given the deficiencies of reliability determinations based on electrical testing alone, some fully or partially non-functional dies may not be detected and are allowed to enter the supply chain. Such dies are commonly referred to as "test escapes." It is recognized herein that the accurate detection of test escapes is becoming increasingly important in industries such as the automotive industry. For example, the fusion processors needed to support autonomous and advanced drive assistance systems (ADAS) may require complex semiconductor devices (e.g., graphical processing units (GPUs), memory protection units (MPUs), system on chip (SOC) devices, or the like) that may be relatively difficult or inefficient to fully test using electrical techniques. By way of another example, the increasing use of sensors (cameras, LIDAR, or the like) may be similarly difficult or inefficient to fully test using electrical techniques.

Beyond pass/fail electrical testing, reliability studies have shown that semiconductor parts that have abnormal electrical characteristics relative to similar parts in a common population tend to be higher contributors to long-term quality and reliability problems. Specifically, devices that pass all manufacturing and electrical tests, but are nonetheless considered outliers compared to other parts in the same population or lot are more likely to fail in the field.

Part average testing (PAT) generally refers to statistical methods for identifying dies having abnormal characteristics (e.g., outliers). Semiconductor devices are typically fabricated as or include dies formed from patterned layers on a sample (e.g., a semiconductor wafer). Further, many dies with the same design are typically fabricated on a single sample and multiple samples are fabricated together as a lot. PAT methodologies may thus compare dies from the same sample or from samples in a common lot to determine statistical outlier dies that have a higher probability to exhibit reliability problems than other dies in the population. These outliers may then be inked off and either removed from the supply chain (e.g., discarded) or flagged for further testing.

In a general sense, guidelines for determining what devices qualify as outliers may be established based on an analysis of a sampling of devices having the same or substantially similar designs (e.g., devices in a selected population). In this way, a distribution of test results for each test requirement and this data may be used as the basis for establishing PAT limits. Further, PAT limits may be guided by industry standards. For example, standards associated with devices to be used in the automotive industry may be, but are not required to be, established or guided by the Automotive Electronics Council.

PAT methodologies may also utilize additional information as predictors of die reliability. For example, Parametric Part Average Testing (P-PAT) may flag a die as having a higher probability for failure based on having a parametric signal outside the norm for devices in the population, but still within the specifications. By way of another example, Geographical Part Average Testing (G-PAT) may flag a die as having a higher probability for failure based on geographic proximity to other outlier dies. For instance, a "good die in a bad neighborhood" of outlier dies (GDBN) may be flagged by G-PAT. By way of a further example, Composite Part Average Testing (C-PAT) may flag a die as having a higher probability for failure based on a number of repairs on the die during fabrication.

It is contemplated herein that a critical challenge associated with the application of PAT methodologies for reliability control is balancing reliability standards for a given application with the efficiency and accuracy of the control process. For example, PAT methodologies may be susceptible to "overkill" in which otherwise good dies with a low chance of early life failure are improperly inked off, resulting in decreased throughput of the production line and increased cost per device. Further, new reliability standards for the automotive industry, mobile devices, or the like may require part-per-billion control levels of reliability defect control. Meeting these stringent standards at a reasonable cost and throughput demands efficient and accurate predictions of the reliability of devices. In this way, it may be desirable to avoid, limit, or otherwise limit overkill by accurately and efficiently identifying dies susceptible to reliability issues.

In-line part average testing (I-PAT) extends the general PAT methodology by taking into consideration inspection results provided by in-line sample analysis tools (e.g., inspection tools and/or metrology tools) that detect defects on one or more layers of a device during processing (e.g., during manufacturing of the device). Reliability studies have indicated that the majority of defects that result in immediate or latent reliability failures can be detected in-line using in-line sample analysis tools. Accordingly, I-PAT methodologies based on defects identified by in-line sample analysis tools may effectively identify devices susceptible to immediate or early-life reliability failures. These identified devices may then be removed from the supply chain (e.g., discarded) or subjected to further testing. In-line part average testing (I-PAT) is generally described in U.S. Pat. No. 10,761,128 issued on Sep. 1, 2020, which is incorporated herein by reference in its entirety. For example, an I-PAT methodology may generally include detecting defects in one or more layers of a die and determining a number of total identified defects in the die as a defectivity score. In this way, dies with many identified defects may be either removed from the supply chain or identified for further testing.

It is recognized that semiconductor devices may commonly include defects of some sort that are detectible using in-line sample analysis tools. However, not all defects identified by in-line defect inspection systems result in reliability problems for the fabricated device. Existing I-PAT techniques may thus suffer from high inspection sampling rates and/or overkill associated with improperly inking off good devices. As a result, existing I-PAT techniques may fail to achieve stringent reliability standards (e.g., part-per-billion control) while also meeting throughput and cost requirements. It is thus particularly important to provide accurate and efficient identification of reliability defects, or defects that have a statistically higher probability of inducing device failures (e.g., immediate failures, early-life failures, or the like).

Embodiments of the present disclosure are directed to advanced I-PAT methodologies for reliability defect detection. The systems and methods disclosed herein may be suitable for detecting a wide range of defects including, but not limited to, killer defects that may result in immediate device failure or latent defects that may result in early-life failure.

Some embodiments of the present disclosure are directed to detecting latent defects that may not result in immediate failure, but may result in premature or early-life failure of the device when utilized in a working environment.

In one embodiment, dies including one or more identified defects may be inked off based on geometric considerations such as wafer-level patterns and/or proximity to dies that fail electrical testing (e.g., e-test failures). For example, a die may be inked-off based on a defect-guided G-PAT methodology. Traditional G-PAT methodologies may ink off dies that are physically proximate to a selected number of e-test failure dies based on a presumption that dies physically close to e-test failure dies are more likely to exhibit early-life failures due to wafer-level defectivity issues based on root causes that span multiple dies. However, it is contemplated herein that traditional G-PAT methodologies may fail to accurately identify wafer-level patterns and thus often suffer from substantial overkill in which large numbers of good dies are improperly inked off. It is further contemplated herein that defects identifiable using in-line sample analysis tools (e.g., in-line defectivity) is commonly a root cause of wafer-level defectivity issues. Accordingly, in one embodiment, G-PAT ink-off decisions are guided by a defect analysis. For example, I-PAT data associated with identified defects (e.g., a total number of identified defects in a die) may be overlaid or otherwise combined (either visually or via a controller) with e-test failures to identify wafer-level defectivity patterns. In this way, overkill may be reduced by selectively inking off die that lie within the identified pattern rather than simply relying on a number of proximate e-test failure die.

In another embodiment, identified defects in one or more layers of a die are weighted with a weighting scheme that assigns weights based on a predicted likelihood that the defects will impact the reliability of the device. Subsequently, the weighted defects in all analyzed layers of the die may be aggregated to generate a weighted defectivity score for the die. In this way, dies within a given population may be analyzed against each other based on the weighted defectivity score such that outlier die may be identified and inked off. For example, dies within a population may be sorted based on the values of the weighted defectivity score such that outlier values may be clearly identified. Further, the outlier die may be identified based on the weighted defectivity score using a variety of techniques including, but not limited to, an I-PAT outlier chart (e.g., an IOC chart) for visual determination, automated or machine-learning algorithms, global economic yield-based limits evaluated statically or dynamically, N-class weighting (e.g., 3-class weighting) of defects into classes with different predicted impact on reliability, geometric considerations (e.g., defect clusters, proximity to dies that fail electrical tests, or the like), or a combination of multiple techniques (e.g., an ensemble approach).

Some embodiments of the present disclosure are directed to I-PAT methodologies for detecting "killer" defects that result in immediate device failure. As described previously herein, such killer defects may be detectable using electrical testing, though some may go undetected and manifest as test escapes. It is contemplated herein that killer defects may generally be larger than latent defects (e.g., reliability defects that may result in early-life failure) and may thus be well-suited for identification with in-line sample analysis tools. It is further contemplated herein that the use of I-PAT methodologies for detecting killer defects may not impose any significant downside. In particular, in the case that I-PAT detects a killer defect that is missed by electrical testing (e.g., due to the defect being located in an untestable region, a gap in the test coverage, or the like), then the application of I-PAT prevented a test escape from reaching the supply chain. In the case that I-PAT detects a defect that ultimately leads to a failed electrical test, no additional harm is done and the defect is merely identified twice.

In one embodiment, killer defects are separated from other defects of interest through targeted binning. In this way, defects with characteristics attributed to killer defects (e.g., attributes that increase the likelihood of a defect resulting in a device failure) may be assigned relatively high weights such that dies including one or more of the killer defects are inked off. For example, killer defects may be identified based on a variety of factors including, but not limited to, defect size, defect type, defect binning attributes (e.g., magnitude, polarity, or the like), defect density, metrology data, or defect location (e.g., based on known or suspected hot spots). Further, the killer defects may be identified using a variety of techniques including, but not limited to, deterministic binning methods or machine learning techniques.

In another embodiment, killer defects are separated from other defects of interest using targeted thresholding. In this way, fixed or dynamic limits for the allowable quantity of high-risk defects per die may be set. For example, limits may be set based on various criteria such as, but not limited to, a total number of defects in one or more critical layers or a total number of defects in a die in all inspected layers. Further, the limits may be based on any selected population including, but not limited to, a single wafer, a lot, or multiple lots.

In another embodiment, killer defects are identified at least in part based on presence in targeted care areas. For example, care areas may include areas of a sample associated with known gaps in the electrical test coverage. In this way, defects identified in these care areas may not be identified through electrical testing.

It is to be understood that the labels "killer defects," "latent "latent defects, " "reliability defects" and the like are used herein solely for illustrative purposes and should not be interpreted as limiting. Further, examples of defect-based reliability determination and control described herein related to specific types of defects (e.g., killer defects, latent defects, or the like) are also provided solely for illustrative purposes and should not be interpreted as limiting. Rather, the various methodologies for defect-based reliability predictions may generally be used to identify any type of defect or multiple types of defects, regardless of the label used to describe the defect.

Referring now to FIGS. 1-9C, systems and methods for implementing advanced I-PAT methodologies are described in greater detail in accordance with one or more embodiments of the present disclosure.

FIG. 1 is a block diagram view of a reliability control system 100 in accordance with one or more embodiments of the present disclosure.

In one embodiment, the reliability control system 100 includes at least one inspection tool 102 (e.g., an in-line sample analysis tool) for detecting defects in one or more layers of a sample 104. The reliability control system 100 may generally include any number or type of inspection tool 102. For example, an inspection tool 102 may include an optical inspection tool configured to detect defects based on interrogation of the sample 104 with light from any source such as, but not limited to, a laser source, a lamp source, an X-ray source, or a broadband plasma source. By way of another example, an inspection tool 102 may include a particle-beam inspection tool configured to detect defects based on interrogation of the sample with one or more particle beams such as, but not limited to, an electron beam, an ion beam, or a neutral particle beam.

In another embodiment, the reliability control system 100 includes at least one metrology tool 106 (e.g., an in-line sample analysis tool) for measuring one or more properties of the sample 104 or one or more layers thereof. For example, a metrology tool 106 may characterize properties such as, but not limited to, layer thickness, layer composition, critical dimension (CD), overlay, or lithographic processing parameters (e.g., intensity or dose of illumination during a lithographic step). In this regard, a metrology tool 106 may provide information about the fabrication of the sample 104, one or more layers of the sample 104, or one or more dies of the sample 104 that may be relevant to the probability of manufacturing defects that may lead to reliability issues for the resulting fabricated devices.

In another embodiment, the reliability control system 100 includes at least one electrical test tool 108 for testing the functionality of one or more portions of a manufactured device. The reliability control system 100 may include any number or type of electrical test tool 108 to test, inspect, or otherwise characterize the properties of one or more portions of a fabricated device at any point in the manufacturing cycle. For example, the electrical test tool 108 may include, but is not limited to, a pre burn-in electrical test tool 108 or a post burn-in electrical test tool 108.

In one embodiment, the reliability control system 100 includes a controller 110. The controller 110 may include one or more processors 112 configured to execute program instructions maintained on memory 114 (e.g., a memory medium, memory device, or the like). Further, the controller 110 may be communicatively coupled with any of the components of the reliability control system 100 including, but not limited to, the inspection tool 102, the metrology tool 106, or the electrical test tool 108. In this regard, the one or more processors 112 of controller 110 may execute any of the various process steps described throughout the present disclosure. For example, the one or more processors 112 of controller 110 may receive defect data associated with defects in any sample layer, find correlations between defect attributes and sources of ground truth as a determination of defect relevance, assign weights to defects based on expected impact on reliability, aggregate detected defects across multiple sample layers in a die, or identify outlier die for inking.

The one or more processors 112 of a controller 110 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 112 may include any device configured to execute algorithms and/or instructions (e.g., program instructions stored in memory). In one embodiment, the one or more processors 112 may be embodied as a desktop computer, mainframe computer system, workstation, image computer, parallel processor, networked computer, or any other computer system configured to execute a program configured to operate or operate in conjunction with the reliability control system 100, as described throughout the present disclosure.

The memory 114 may include any storage medium known in the art suitable for storing program instructions executable by the associated one or more processors 112. For example, the memory 114 may include a non-transitory memory medium. By way of another example, the memory 114 may include, but is not limited to, a read-only memory (ROM), a random-access memory (RAM), a magnetic or optical memory device (e.g., disk), a magnetic tape, a solid-state drive and the like. It is further noted that the memory 114 may be housed in a common controller housing with the one or more processors 112. In one embodiment, the memory 114 may be located remotely with respect to the physical location of the one or more processors 112 and the controller 110. For instance, the one or more processors 112 of the controller 110 may access a remote memory (e.g., server), accessible through a network (e.g., internet, intranet and the like).

In one embodiment, a user interface 116 is communicatively coupled to the controller 110. In one embodiment, the user interface 116 may include, but is not limited to, one or more desktops, laptops, tablets, and the like. In another embodiment, the user interface 116 includes a display used to display data of the reliability control system 100 to a user. The display of the user interface 116 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 116 is suitable for implementation in the present disclosure. In another embodiment, a user may input selections and/or instructions responsive to data displayed to the user via a user input device of the user interface 116.

Referring now to FIGS. 2 through 9C, I-PAT methodologies are described in greater detail in accordance with one or more embodiments of the present disclosure.

As described previously herein, I-PAT methodologies may generally evaluate the reliability of a die by performing defect inspection steps on one or more layers of a sample 104, aggregating identified defects located in one or more dies across the sample 104, and isolating or inking off dies that may be considered outliers in the population based on a detected total number of defects in each die in the population.

Figure 2A:
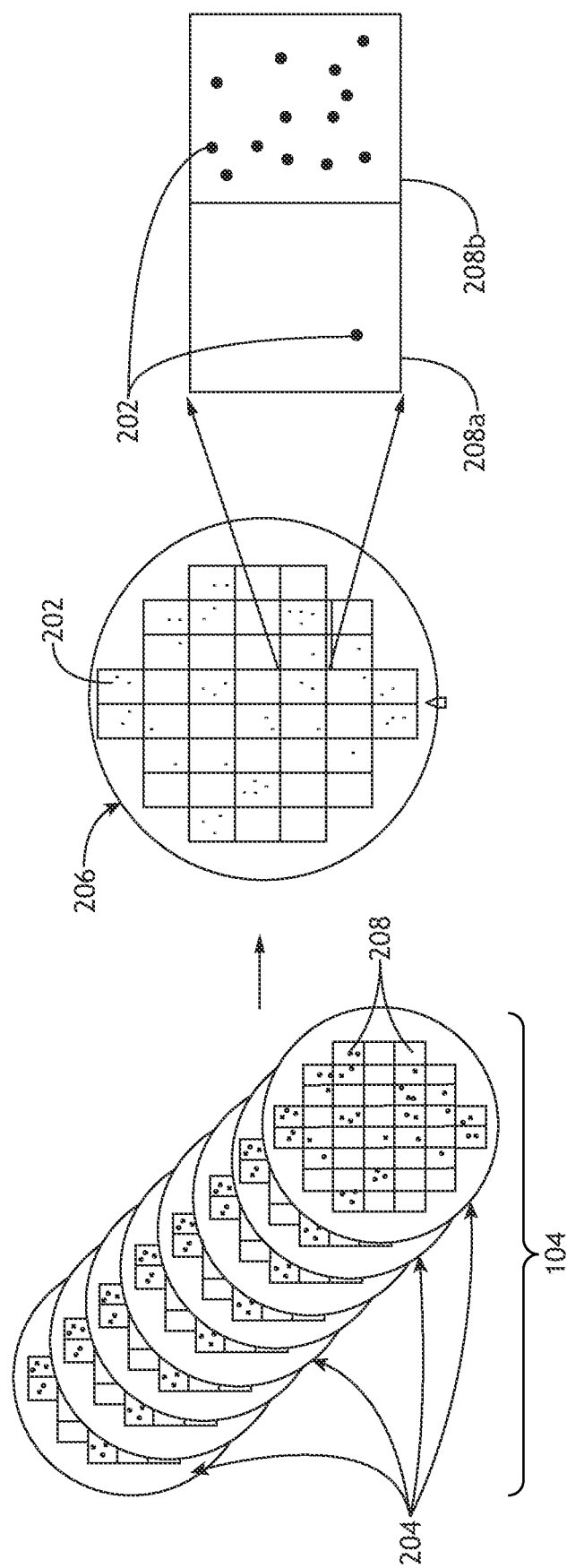
FIG. 2A is a conceptual illustration of the aggregation of defects in multiple layers of a sample, in accordance with one or more embodiments of the present disclosure.

FIG. 2A is a conceptual illustration of the aggregation of defects in multiple layers of a sample 104 in accordance with one or more embodiments of the present disclosure. A variety of defects 202 may be detected in one or more layers 204 of the sample 104 (e.g., 8 layers 204 as illustrated in FIG. 2A) by any component of the reliability control system 100 such as, but not limited to, an inspection tool 102 or a metrology tool 106. These identified defects 202 may then be represented in various ways.

For example, the identified defects may be represented graphically as a stacked die map 206 in which all detected defects are merged into a single top-view representation of the sample 104. In this way, dies from different locations on a sample 104 or dies across different samples 104 may be graphically compared. For instance, the insets in FIG. 2A illustrate a first die 208a and a second die 208b having different identified defects in different layers.

Figure 2B:
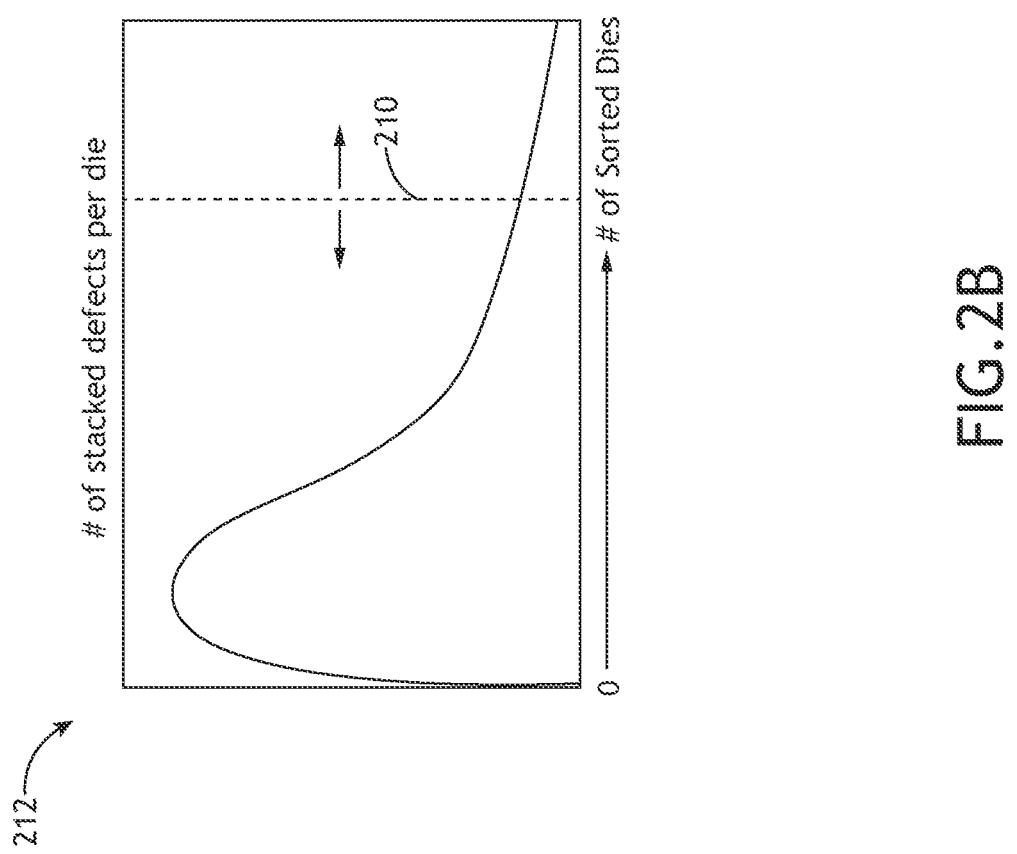
FIG. 2B is a plot illustrating a defect histogram based on a total number of defects in a population, in accordance with one or more embodiments of the present disclosure.

By way of another example, the dies within a population may be sorted by the total number of aggregated defects. In this way, outlier dies having a total number of defects exceeding a threshold 210 (e.g., an I-PAT control limit) may be identified as outlier dies and inked off. FIG. 2B is a plot 212 illustrating a defect histogram based on a total number of defects in a population, in accordance with one or more embodiments of the present disclosure. I-PAT control limits based on a number of stacked defects is generally described in U.S. Pat. No. 10,761,128 issued on Sep. 1, 2020, which is incorporated herein by reference in its entirety.

Advanced I-PAT methodologies disclosed herein improve upon existing I-PAT methodologies in various ways such as by providing weighting schemes for weighting identified defects to more accurately assess the impact of various defects on reliability, generating defectivity scores for dies within a population based on the weighted defects, and providing techniques for selecting cut-off limits (e.g., threshold values of the defectivity score) separating outlier dies from the rest of the population. Further, the systems and methods disclosed herein may be targeted to identify particular defects types or classes (e.g., killer defects in electrically untested areas that would result in test escapes) or may provide broad analysis of dies including a wide range of defect types or classes.

Figure 3A:
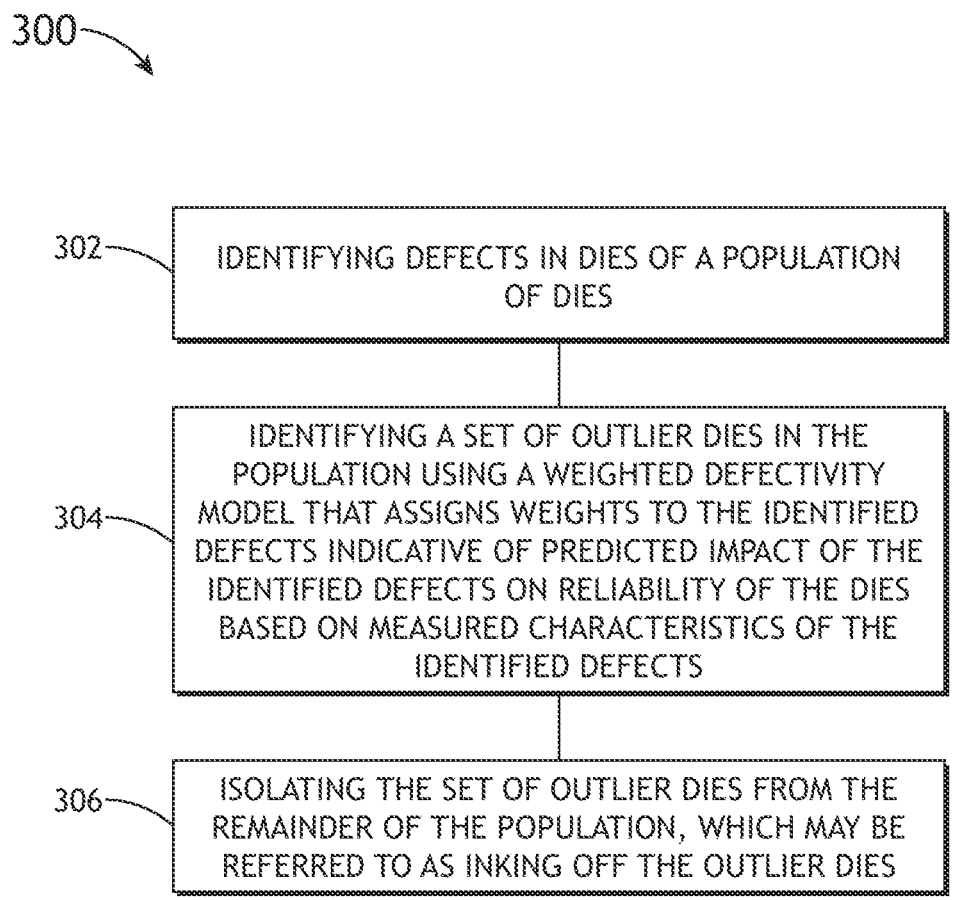
FIG. 3A is a flow diagram illustrating steps performed in a method for reliability determination based on in-line defect detection in accordance with one or more embodiments of the present disclosure.

FIG. 3A is a flow diagram illustrating steps performed in a method 300 for reliability determination based on in-line defect detection in accordance with one or more embodiments of the present disclosure. Applicant notes that the embodiments and enabling technologies described previously herein in the context of the reliability control system 100 should be interpreted to extend to the method 300. It is further noted, however, that the method 300 is not limited to the architecture of the reliability control system 100.

In one embodiment, the method 300 includes a step 302 of identifying defects in dies of a population of dies. For example, defects may be identified using any combination of in-line sample analysis tools (e.g., inspection tools 102 or metrology tools 106) after one or more processing steps (e.g., lithography, etching, or the like) for layers of interest in the dies. In this regard, the defect detection at various stages of the manufacturing process may be referred to as in-line defect detection. Further, the population under consideration in the method 300 may include any selected dies within any selected number of samples 104. For example, a population may include, but is not limited to, selected dies from a single sample 104, multiple samples 104 within a lot (e.g., a production lot), or selected samples 104 across multiple lots.

For the purposes of the present disclosure, a defect may be considered to be any deviation of a fabricated layer or pattern in a layer from design characteristics including, but not limited to, physical, mechanical, chemical, or optical properties. Further, a defect may have any size relative to a die or features thereon. In this way, a defect may be smaller than a die (e.g., on the scale of one or more patterned features) or may be larger than a die (e.g., as part of a wafer-scale scratch or pattern). For example, a defect may include deviation of a thickness or composition of a sample layer before or after patterning. By way of another example, a defect may include a deviation of a size, shape, orientation, or position of a patterned feature. By way of another example, a defect may include imperfections associated with lithography and/or etching steps such as, but not limited to, bridges between adjacent structures (or lack thereof), pits, or holes. By way of another example, a defect may include a damaged portion of a sample 104 such as, but not limited to, a scratch, or a chip. By way of another example, a defect may include a foreign particle introduced to the sample 104. Accordingly, it is to be understood that examples of defects in the present disclosure are provided solely for illustrative purposes and should not be interpreted as limiting.

In another embodiment, the method 300 includes a step 304 of identifying a set of outlier dies in the population using a weighted defectivity model, where the weighted defectivity model assigns weights to the identified defects indicative of predicted impact of the identified defects on reliability of the dies based on measured characteristics of the identified defects. Further, in some embodiments, the set of outlier dies passes one or more electrical tests assessing the functionality of the dies in the population. In this way, the set of outlier dies may represent dies within the population that are operational at the time of manufacture (e.g., having passed the one or more electrical tests in step 304), but are predicted to exhibit reliability issues such as, but not limited to, early life failure when in a working environment.

As is discussed in greater detail below, it is contemplated herein that outlier dies may be identified using a variety of weighted defectivity models and may be based on various measured characteristics of the identified defects. Further, in some embodiments, multiple weighted defectivity models may be utilized and considered. In this way, each weighted defectivity model may identify a potentially different set of candidate outlier dies and the step 304 may generate a final set of outlier dies based on a combination or subset of the candidate outlier dies. For example, the final set of outlier dies may include candidate outlier dies identified by a selected number of the weighted defectivity models.

In another embodiment, the method 300 includes a step 306 of isolating at least a portion of the set of outlier dies from the remainder of the population, which may be referred to as inking off the outlier dies. It is contemplated herein that numerous actions may be taken after isolating or inking a die. For example, an isolated die may be subjected to additional testing (e.g., additional electrical testing of untested areas of the die, stress testing, or the like) to further analyze the performance of the die and its expected reliability or lifespan in an operational environment. By way of another example, an isolated die may be removed from a distribution supply immediately or after additional testing. By way of a further example, in the case where a particular die may be utilized in multiple working environments with different reliability standards, an isolated die may be placed in a distribution supply for a working environment in which reliability standards are relatively low.

Additionally, the step 306 of isolating at least a portion of the set of outlier dies may be performed by any combination of user input or algorithmic techniques. In one embodiment, the step 306 includes isolating the entire set of outlier dies for either further testing or removal from a distribution supply. In this way, the steps 302-304 are sufficient to identify dies for removal from the population. In another embodiment, the step 306 includes performing an algorithmic determination of determining which of the outlier dies should be immediately discarded and which may be suitable for further testing with the potential of entering the distribution supply based on the results of the testing.

In another embodiment, the step 306 includes presenting a user with the set of outlier dies such that the user may make a final judgment on how to proceed. In this way, a user (e.g., a test engineer, or the like) may use his or her judgment to add to the set of outlier dies, remove dies from the set of outlier dies, flag one or more outlier dies for further testing, flag one or more outlier dies to be discarded, or the like. For example, the step 306 may include providing die maps of one or more samples 104 with various defect-related information. For instance, a die map may differentiate outlier dies from the remainder of the population (e.g., by color or other characteristics). In another instance, a die map may include defectivity scores for outlier and/or non-outlier dies across the sample 104. In another instance, a die map may include representations of defect locations across the sample 104.

Figure 3B:
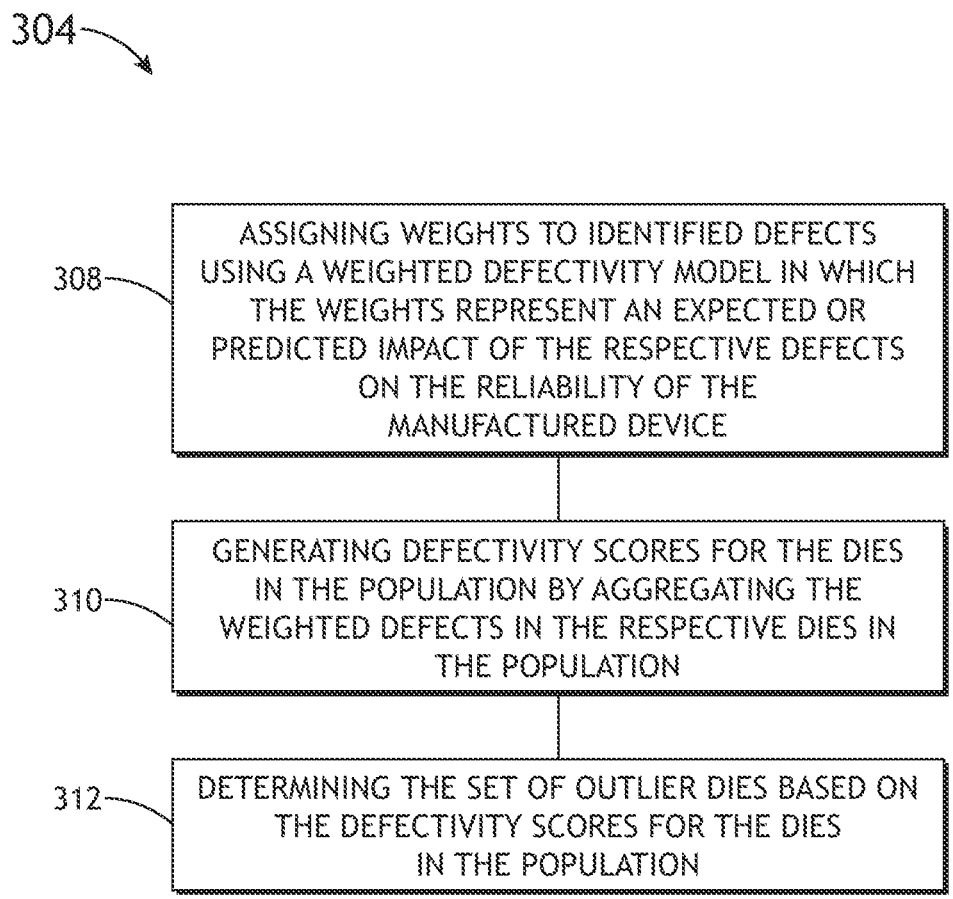
FIG. 3B is a flow diagram illustrating steps associated with identifying a set of outlier dies in the population using a weighted defectivity model in accordance with one or more embodiments of the present disclosure.

FIG. 3B is a flow diagram illustrating steps (or sub-steps) associated with identifying a set of outlier dies in the population using a weighted defectivity model (e.g., step 304 of the method 300) in accordance with one or more embodiments of the present disclosure.

In one embodiment, the step 304 includes a step 308 of assigning weights to identified defects using a weighted defectivity model in which the weights represent an expected or predicted impact of the respective defects on the reliability of the manufactured device. In another embodiment, the step 304 includes a step 310 of generating die-based defectivity scores for the dies in the population by aggregating the weighted defects in the respective dies in the population. In another embodiment, the step 304 includes a step 312 of determining the set of outlier dies based on the defectivity scores for the dies in the population.

The defectivity score for a particular die may be an indicator of the reliability of the particular die as characterized by the selected weighted defectivity model. In particular, the defectivity score may represent an inverse metric for reliability such that dies having higher values of the defectivity score may be predicted to be less reliable (e.g., predicted to exhibit early life failures when in an operational environment, or the like). Accordingly, the higher the value of the defectivity score for a particular die, the less reliable it is predicted to be.

Referring now to the step 308 of assigning weights to the identified defects using a weighted defectivity model, it is contemplated herein that not all defects present on the sample 104 may impact reliability in the same manner. Rather, the impact of a particular defect in a particular layer of a manufactured device on the reliability of the manufactured device may be affected by numerous factors including, but not limited to, characteristics of the particular defect itself, the location of the particular defect on the sample or within a particular circuit, relationships between multiple defects, the particular design or function of the manufactured device, or the operational tolerances of the manufactured device in an intended working environment. Accordingly, it is contemplated herein that numerous weighted defectivity models may be generated in accordance with the embodiments of the present disclosure to be suitable for a particular application. In this way, the particular examples herein are provided solely for illustrative purposes and should not be interpreted as limiting.

A weighted defectivity model may generally accept numerous types of inputs associated with measurements of a sample 104 with an in-line sample analysis tool (e.g., an inspection tool 102 and/or a metrology tool 106).

In one embodiment, inputs to a weighted defectivity model include one or more measured characteristics of the defect that may be correlated to predicted impacts on performance or lifetime of the manufactured device. For example, weights may be applied based on a measure of a deviation from a design specification (e.g., film thickness; size, shape, orientation, or position of a fabricated feature; or the like). By way of another example, weights may be applied based on identified defect type. For instance, defect types may include, but are not limited to, scratches, pits, holes, bridges, particulates, or design deviations. Further, the severity of the defect (e.g., the length of a scratch, the depth of a pit, measured magnitude or polarity of the defect, or the like) may be further considered in the weighted defectivity model.

In another embodiment, inputs to a weighted defectivity model include a relationship between a particular defect and one or more other identified defects. For example, weights may be applied based on defect density on a particular layer, defect density in a particular location across multiple layers, spatial defectivity patterns, or the like. It is contemplated herein that in some cases, defects that are part of patterns or hot spots may be, but are not required to be, more likely to impact reliability of the manufactured device and may thus be weighted accordingly.

In another embodiment, inputs to a weighted defectivity model include measured characteristics of a portion of the sample 104 surrounding an identified defect. It may be the case that sample characteristics surrounding a defect may be indicative of whether a particular identified defect is an isolated defect or whether it is part of a larger pattern of defects. For example, characteristics such as, but not limited to, film or layer thickness, film composition, wafer flatness, wafer topography, resistivity, localized stress measurements, or critical dimension measurements may be indicative of a hotspot or spatial pattern in which additional defects may be likely to occur or for which reliability may be particularly impacted.

In another embodiment, inputs to a weighted defectivity model include a location of a defect within selected areas or predefined areas of a sample 104. It may be the case that defects in certain areas of a die may be more or less likely to result in reliability issues in the manufactured device. In a general sense, different portions of a die may generally include different patterns or structures suitable for performing different functional operations. As a result, different portions of a die may be more or less sensitive to particular types of defects or in some cases more or less sensitive to defects of any type. Further, differences in the sensitivity of different portions of a die to defects may stem from differences in physical design, operational characteristics (e.g., values of current or voltage during operation), and/or manufacturing sensitivity. Accordingly, various care areas may be defined that include one or more locations on a die, where each of the care areas may be subject to different weighting conditions. In some cases, different weighted defectivity models may be applied to different care areas of the sample.

For example, it may be the case that a defect in a portion of a die having a high pattern density may have a greater impact on reliability than a defect in a portion of a die having a low pattern density, particularly when the size of the defect is on the order of the size of the patterns. Accordingly, a defect with a particular size may be given a relatively higher weight when located in a high-density area than when located in a low-density area.

By way of another example, it may be the case that certain portions of a die may have tighter manufacturing tolerances than other portions of a die. Accordingly, a defect may be given a relatively higher weight when located in a portion of a die with a tighter manufacturing tolerance than when located in a portion of a die with a more relaxed manufacturing tolerance.

By way of another example, it may be the case that different portions of a die or certain dies on a sample 104 may impact the overall yield of a device production line in different ways. For instance, some semiconductor-based devices may be formed as complex devices that incorporate multiple dies of different functionalities to form a complete circuit. In this way, it may be the case that inking off certain dies, or portions thereof, may have more or less impact on the overall production yield than other dies such that defects in these areas may be weighted accordingly.

By way of another example, it may be the case that a particular electrical testing scheme does not fully test all portions of a die such that defects in these regions may contribute to test escapes in which reliability issues are not detected by the electrical testing. Accordingly, defects may be assigned higher weights in portions of a die associated with untested or weakly tested areas based on a particular electrical testing scheme than in other portions of a die. Further, in some embodiments, defects in such areas may be weighted so heavily as to guarantee (or at least make it very likely) that dies with defects in these areas are inked off.

Further, it is contemplated herein that different care areas having different weighting considerations may be identified or determined using a variety of techniques.

Figure 4A:
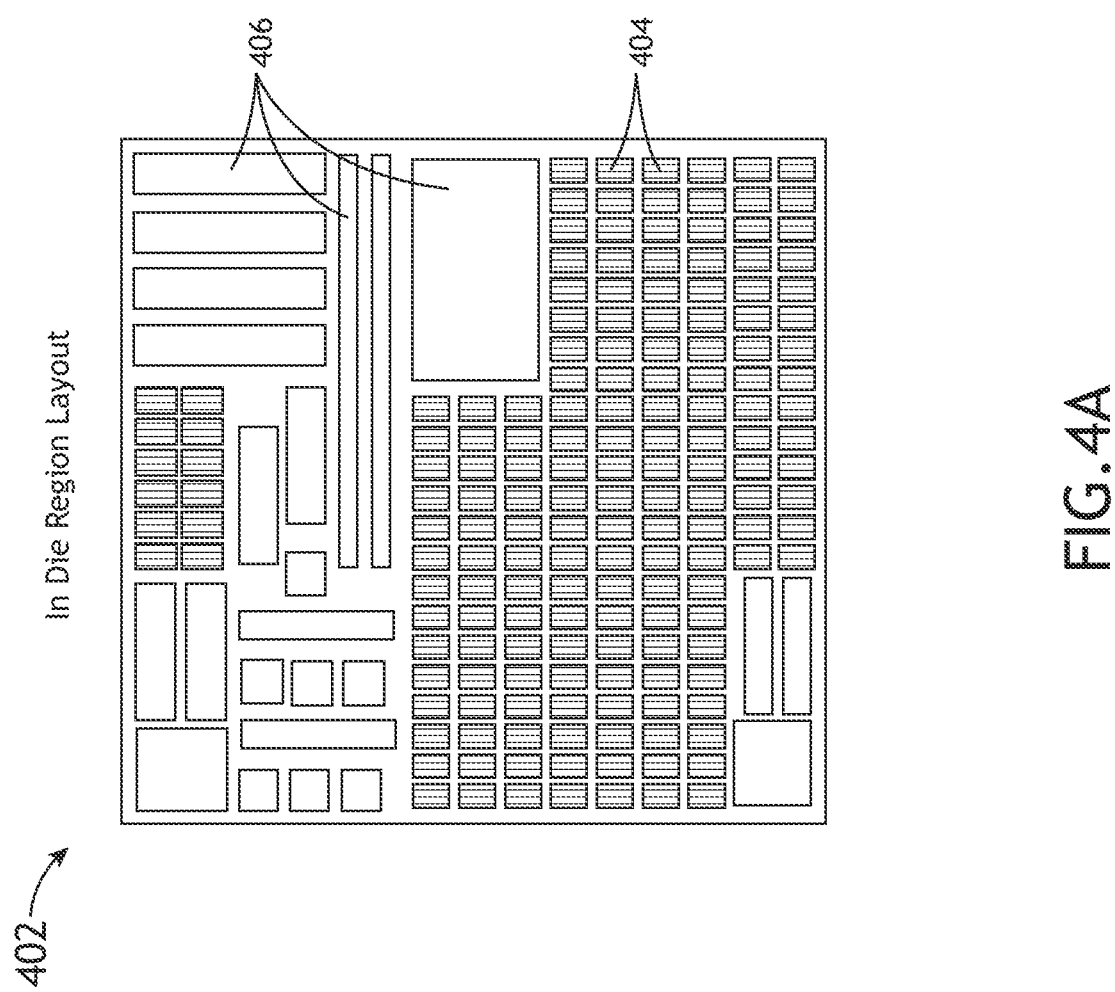
FIG. 4A is a schematic view of a die with various critical areas and non-critical areas, in accordance with one or more embodiments of the present disclosure.

FIG. 4A is a schematic view of a die 402 with various critical areas 404 (indicated as hatched) and non-critical areas 406 (indicated as open) in accordance with one or more embodiments of the present disclosure. In one embodiment, a first set of care areas may be defined to include the critical areas 404 and a second set of care areas may be defined to include the non-critical areas 406.

In one embodiment, care areas are defined on an in-line sample analysis tool during a recipe set up. In this way, different inspection or metrology recipes may be utilized in the different care areas. In another embodiment, care areas are defined based on design information such as, but not limited to, a graphic design system (GDS) file containing die layout information, netlist data, or the like. In another embodiment, care areas are manually provided by a user (e.g., within defect analysis software).

Figure 4B:
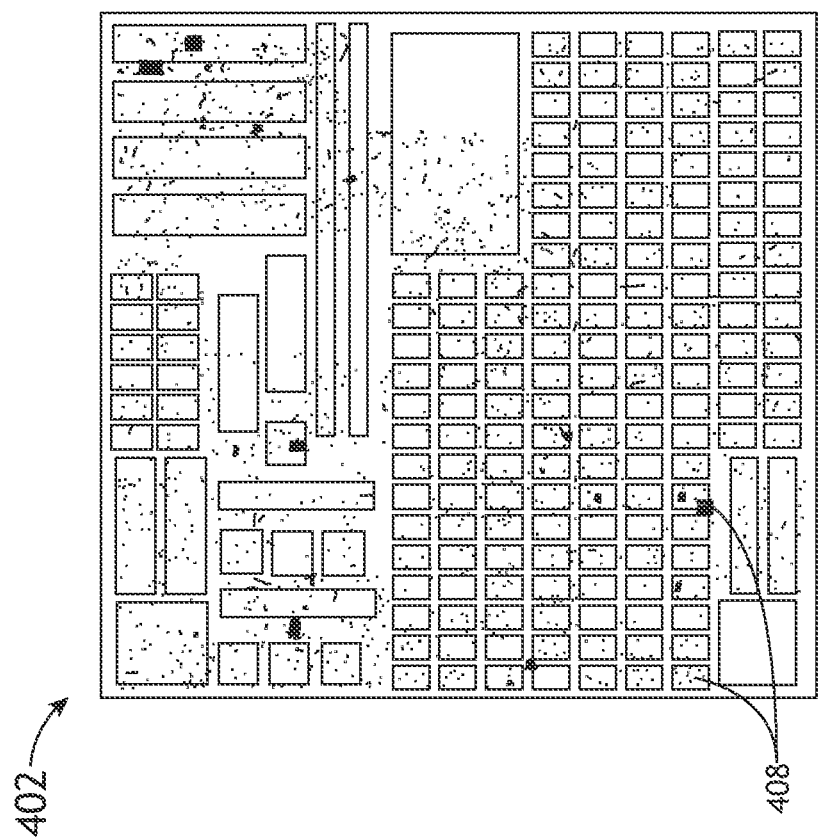
FIG. 4B is a stacked defect map of the die illustrated in FIG. 4A, in accordance with one or more embodiments of the present disclosure.
Figure 4C:
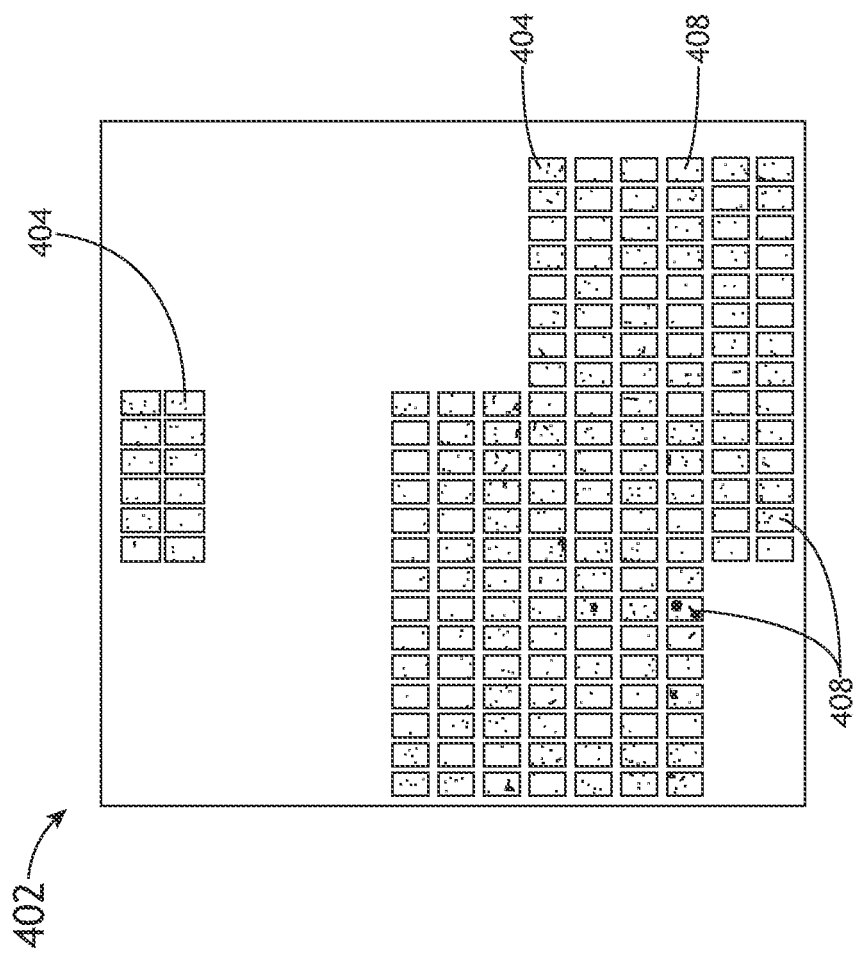
FIG. 4C is the stacked defect map of FIG. 4B in which only defects in the critical areas are shown, in accordance with one or more embodiments of the present disclosure.

Referring now to FIGS. 4B and 4C, the different treatment of different care areas is illustrated in greater detail in accordance with one or more embodiments of the present disclosure. FIG. 4B is a stacked defect map of the die illustrated in FIG. 4A in accordance with one or more embodiments of the present disclosure. As illustrated in FIG. 4B, various in-line defects 408 are identified throughout both the critical areas 404 and non-critical areas 406. FIG. 4C is the stacked defect map of FIG. 4B in which only defects in the critical areas 404 (e.g., the first set of care areas) are shown, in accordance with one or more embodiments of the present disclosure. In this way, defects within the critical areas 404 may be separately considered.

It is contemplated herein that a stacked defect map including defects in selected care areas such as the one illustrated in FIG. 4C may be generated before or after inspection. For example, in the case where one or more care areas are designed to be non-critical such that defects within these care areas may be disregarded, an in-line sample analysis tool (e.g., an inspection tool 102 and/or metrology tool 106) may be configured based on a care area map to simply not inspect the die for defects in these care areas. Alternatively, the in-line sample analysis tool may be configured to inspect the die for defects in all areas, but the defects in these care areas may be given weights of zero such that they are disregarded.

It is to be understood, however, that the example of two sets of care areas in FIGS. 4A-4C and the associated descriptions is provided solely for illustrative purposes and should not be interpreted as limiting. Rather, a particular die may include any number of care areas that may each have different weighting considerations.

Referring again generally to the step 308 of assigning weights to identified defects using a weighted defectivity model, it is contemplated herein that the weights may be generated based on a correlation between the inputs to the weighted defectivity model with known, measured, simulated, or predicted impacts to reliability.

In one embodiment, a weighted defectivity model assigns weights based on sources of ground truth relevance associated with known, measured, simulated, or predicted relationships between reliability and any inputs to the weighted defectivity model.

For example, a weighted defectivity model may assign weights based on ground truth indicators of reliability issues by comparing the inputs to the model associated with in-line inspection and/or metrology measurements to a library of similar attributes and associated impacts on reliability. In this way, attributes measurable by the inspection tools 102 and/or the metrology tools 106 during in-line defect inspection may be sufficient to generate a "fingerprint" of various defect types, which may then be accumulated into the library and linked to known, measured, simulated, or predicted impacts on reliability of the manufactured device. Further, the library may be generated in any suitable manner including, but not limited to, through analysis of one or more test samples with known reliability issues, modeling, and/or simulations. Manufacturing fingerprints are generally described in U.S. Patent Application No. 2019/0295908 published on Sep. 26, 2019, which is incorporated herein by reference in its entirety.

By way of another example, a weighted defectivity model may assign weights based on correlations between the inputs to the model and reliability issues generated using a correlation engine, a machine learning algorithm, or the like. Such correlations may be generated using any analysis technique known in the art such as, but not limited to, classification, sorting, clustering, outlier detection, signal response metrology, regression analysis, instance-based analysis (e.g., nearest neighbor analysis, or the like), dimensionality reduction (e.g., factor analysis, feature extraction, principal component analysis, or the like) supervised learning (e.g., artificial neural networks, support-vector machines, random forests, or the like), semi-supervised learning (e.g., generative models, or the like), unsupervised learning (e.g., vector quantization, or the like), deep learning, or Bayesian statistics. It is to be understood that the analysis techniques and any associated labels are provided solely for illustrative purposes and are not intended as limiting. It is recognized herein that analysis techniques may be described and/or categorized in a variety of ways. Further, combinations of analysis techniques may be implemented.

Referring again generally to the step 308 of assigning weights to identified defects using a weighted defectivity model, it is contemplated herein that a weighted defectivity model may provide any number of specific weights to identified defects.

In one embodiment, a weighted defectivity assign weights having any value along a continuum or range of values. In this regard, various defects may be assigned any weighted value based on the specific correlation between inputs to the model and measured, simulated, or predicted impacts on reliability.

In another embodiment, a weighted defectivity model may define two or more classes, or bins, of defects having different weights. In this regard, identified defects may be sorted into the classes or bins and weighted accordingly. For example, a three-class weighted defectivity model may include three classes of defects with increasing weights such as, but not limited to, nuisance defects, mid-level defects, and killer defects. It is contemplated herein that a three-class binning model may often provide a suitable balance between too few classes, which may lack a required sensitivity, and too many classes, which may suffer from insufficient accuracy or purity of classification. However, it is to be understood that a weighted defectivity model may utilize any number of classes or bins.

Referring again to FIG. 3B, the step 310 of the generating defectivity scores for the dies in the population by aggregating the weighted defects in the respective dies in the population is described in greater detail in accordance with one or more embodiments of the present disclosure. In this regard, the defectivity score may be considered a die-based score that is representative of the predicted reliability of the dies.

In one embodiment, generating a defectivity score for a die in the population includes generating a numerical value associated with aggregating the weighted defects from the layers of interest. For example, the defectivity score for a particular die may be generated by summing the weighted defects identified in the layers of interest of the particular die. By way of another example, defectivity scores for a particular die may be generated by multiplying the weighted defects identified in the layers of interest of the particular die. In this way, the weights applied to the defects may correspond to kill probabilities and the defectivity score may correspond to an aggregated kill probability associated with the particular die. By way of another example, the defectivity score for a particular die may be generated using a statistical analysis of the weighted defects such as, but not limited to, Bayesian statistics. By way of another example, the defectivity score for a particular die may be generated using a machine learning or other pattern matching technique.

In another embodiment, generating a defectivity score for a die in the population includes generating a graphical (e.g., visual) representation of the aggregated weighted defects in the dies. For example, generating a defectivity score for a die in the population may include generating a weighted stacked defectivity map including the aggregated results of the weighted defects. For instance, defects weighted with values of zero may not be included in a weighted stacked defectivity map. In another instance, defects with different weights may be separately represented in the stacked defectivity map (e.g., using different colors, or the like).

Further, generating a defectivity score may include or otherwise incorporate both numerical and graphical representations. For example, a die map (e.g., a variation of the die map 206 in FIG. 2A) may be generated in which each die is represented or plotted based on the value of the defectivity score. For instance, the die may be colored in the die map based on the values of the defectivity score. It is contemplated herein that a graphical representation of the dies across a sample 104 may facilitate outlier determinations based on a combined analysis of the defect-based defectivity score and electrical testing data.

Referring again to FIG. 3B, the step 312 of determining the set of outlier dies based on the defectivity scores for the dies in the population is described in greater detail in accordance with one or more embodiments of the present disclosure. It is contemplated herein that a set of outlier dies associated with a particular weighted defectivity model may be identified using a variety of techniques.

In some embodiments, the defectivity score provides an absolute predictor of reliability suitable for inking decisions. In this regard, dies having a particular value, range of values, or values beyond a selected threshold value of the defectivity score may be immediately designated as outlier dies such that they may be isolated or inked off (e.g., in the step 306 in FIG. 3A). For example, determining the set of outlier dies based on the defectivity scores associated with aggregated weighted defects may be well-suited for the identification of killer defects that may lead to immediate or early life failures of manufactured devices.

In one embodiment, dies including killer or high-risk defects may be identified using targeted binning. For example, killer or high-risk defects may be classified (e.g., binned) as a separate class than other lower-risk defects and weighted with relatively high weights. In this way, dies including killer or high-risk defects may be identified based on the correspondingly high value of the defectivity score and labeled as outlier dies regardless of the values of the defectivity scores for other dies in the population. In another embodiment, killer or high-risk defects may be identified in targeted care areas associated with untested or partially tested regions of the sample based on a selected electrical testing scheme. Further, these targeted care areas may, but are not required to, be subjected to a dedicated or targeted weighted defectivity model tailored to detect test escapes or may utilize a weighted defectivity model.

As described with respect to the step 308 of assigning weights to defects, killer or high-risk defects may be identified and weighted based on any number of attributes including, but not limited to, defect-related attributes (e.g., defect size, defect type, magnitude, polarity, defect quantity in a given layer or spatial region on the sample 104, or the like), metrology-related attributes (e.g., film or layer thickness, film composition, wafer flatness, wafer topography, critical dimension measurements, resistivity, localized stress information, or the like), or relationships between defects (e.g., known or suspected hot-spots, spatial defect patterns, or the like).

In some embodiments, the defectivity score provides a relative predictor of reliability such that outlier dies may be determined based on a comparison or analysis of the defectivity scores of dies within a population. For example, the defectivity scores of dies within the population may be compared to each other and an outlier cutoff threshold may be determined based on the defectivity score.

Figure 5:
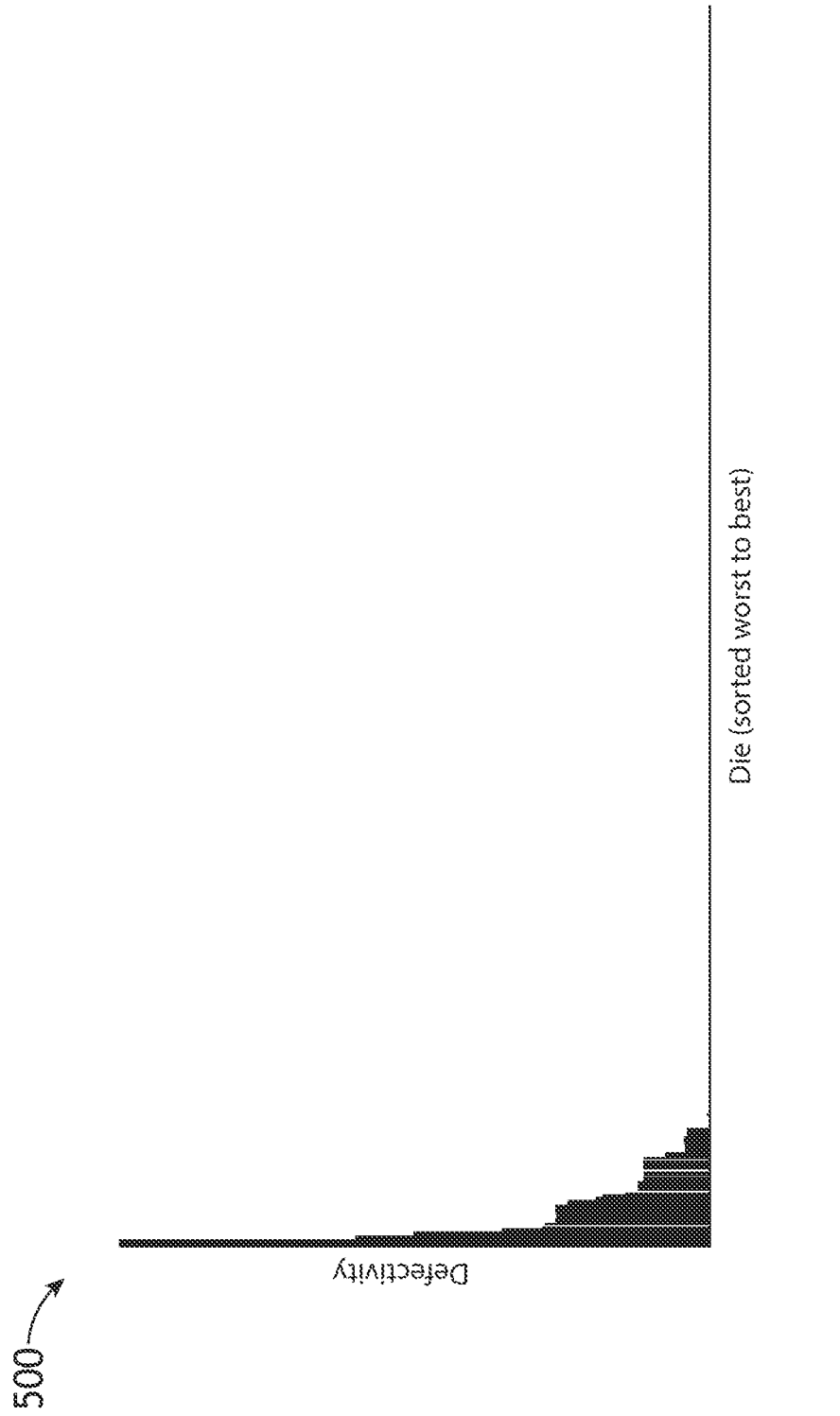
FIG. 5 is an I-PAT outlier chart, in accordance with one or more embodiments of the present disclosure.

In one embodiment, the step 312 of determining the set of outlier dies based on the defectivity scores for the dies in the population includes generating an outlier chart (e.g., an I-PAT outlier chart or IOC) in which the values of the defectivity score for dies in the population are sorted and plotted (e.g., from worst to best). In this way, an IOC chart may be a form of a Pareto chart. For example, FIG. 5 is an I-PAT outlier chart 500 in accordance with one or more embodiments of the present disclosure. In the IOC of FIG. 5, the dies in a population are sorted from worst to best along the x-axis and the values of the defectivity scores of the dies are plotted along the y-axis. As illustrated in FIG. 5, an IOC chart may provide a graphical indicator of the distribution of defectivity scores across the population and may be utilized to determine which dies in the population have values of the defectivity score that may be considered outliers relative to other dies in the population such that the outlier dies may be identified and isolated (e.g., in step 306).

A set of one or more outlier dies in the population may be determined based on the IOC chart using a variety of techniques. In one embodiment, the IOC chart may be graphically provided to a user such that the user may manually determine which dies in the population are outliers. For example, using the IOC chart in FIG. 5, a user may select dies to the left of a visually-determined threshold (e.g., a defectivity limit) as outlier dies.

It is to be understood, however, that an IOC chart need not be graphically represented or produced. Rather, the process of determining outlier dies based on a mathematical, statistical, or algorithmic analysis of the defectivity scores of dies in a population. In another embodiment, dies having a defectivity score value higher than a statistically-defined threshold (e.g., an average value, or the like).

In some embodiments, cutoff limits separating outlier dies from the population may be based on economic or yield considerations. It is contemplated herein that fabrication lines may be sensitive to yield loss associated with inking off dies from a population for any reason and may be particularly sensitive to overkill associated with inking off otherwise reliable dies due to inaccurate reliability predictions. Accordingly, static or dynamic cutoff limits based on economic or yield considerations may balance competing goals of high reliability standards (e.g., parts per billion reliability standards) and economic or yield metrics.

In one embodiment, the selection of dies as outliers in step 312 is subject to an upper limit based on economic or yield considerations. For example, in the case that the application of any of the techniques for determining a set of outlier dies based on defectivity scores associated with a particular weighted defectivity model identifies more potentially unreliable dies than the upper limit, the actual number of dies identified as outlier dies may be capped by the upper limit.

In another embodiment, the selection of dies as outliers in step 312 includes defining a global defectivity limit based on a selected population of dies (e.g., a training population) prior to runtime, where the global defectivity limit represents a cutoff value or threshold of the defectivity score based on the training population. For example, the global defectivity limit may be generated by generating defectivity scores for the dies in the training population based on aggregating weighted defects according to a selected weighted defectivity model, determining outlier dies of the training population based on the defectivity scores for the dies in the training population, and defining the global defectivity limit as a cutoff value of the defectivity score separating outlier dies of the training population from the remainder of the training population. In this way, the static global defectivity limit may be generated by applying steps 308-312 illustrated in FIG. 3B to a training population.

This global defectivity limit may then be applied to future populations of dies in a consistent manner. Additionally, the training population may be, but is not required to be, larger than populations of dies considered during runtime. In the case that the training population is larger than run-time populations, the generated global defectivity limit may be based on a statistically meaningful dataset and may provide reliable limits that may be applied to future populations.

Figure 6:
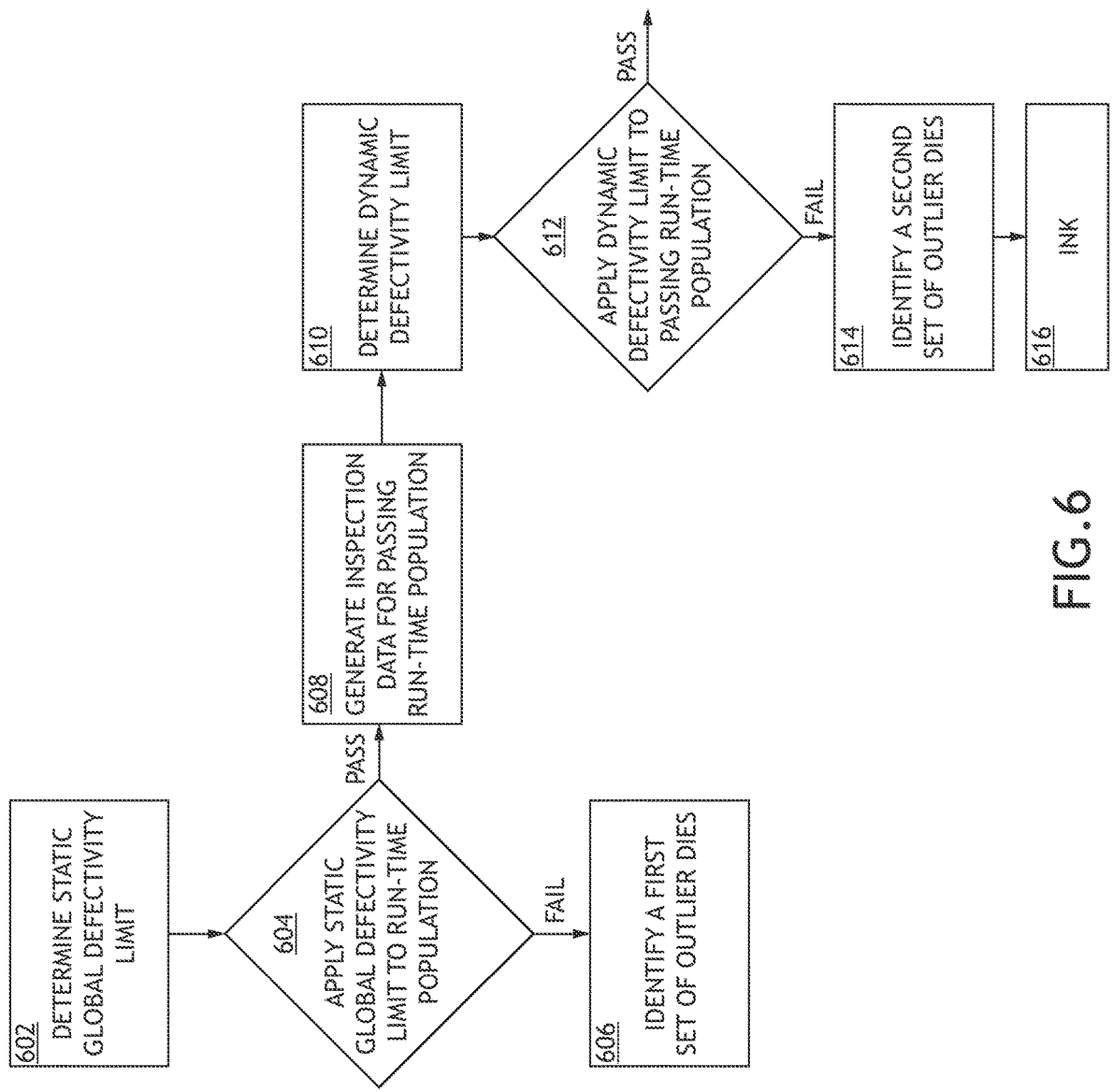
FIG. 6 is a block diagram illustrating a method for reliability determination based on in-line defect detection with both static and dynamic defectivity limits, in accordance with one or more embodiments of the present disclosure.

In another embodiment, the selection of dies as outliers in step 312 includes both a static global defectivity limit based on a training population and dynamic defectivity limits based on individual populations analyzed during runtime. FIG. 6 is a block diagram illustrating a method 600 for reliability determination based on in-line defect detection with both static and dynamic defectivity limits, in accordance with one or more embodiments of the present disclosure. It is contemplated herein that a global defectivity limit based on a training population may reliably remove many of the most significant outlier die and may facilitate a more sensitive and accurate identification of outlier die based on the dynamic limits based on each population during runtime. In particular, removing the most significant outlier die with the static global defectivity limit may make it easier to identify more subtle outliers in the population.

In one embodiment, the method 600 includes a step 602 of determining a static global defectivity limit. For example, the static global defectivity limit may be determined by generating inspection data for a training population, generating defectivity scores for the training population based on aggregating weighted defects according to a selected weighted defectivity model, determining outlier dies of the training population based on the defectivity scores for the dies in the training population, and defining the static global defectivity limit as a cutoff value of the defectivity score separating outlier dies of the training population from the remainder of the training population. In this way, the static global defectivity limit may be generated by, but is not required to be generated by, applying steps 308-312 illustrated in FIG. 3B to a training population. By way of another example, the static global defectivity limit may be determined based on economic or yield considerations or limits. For instance, a static global defectivity limit may include inking off a selected percentage of the most defective dies (e.g., the most defective 1% of dies in a population). Further, the static global defectivity limit may be based on gross or net production numbers. In this way, the static global defectivity limit may include or exclude dies that fail electrical tests and would thus otherwise be inked off. For example, a static global defectivity limit applied to gross production numbers may include generating defectivity scores for a training population, identifying a value of the defectivity score that separates the 1% most defective dies from the remainder of the population, and using this value of the defectivity score as the static global defectivity limit to identify outlier dies to be inked off for future populations. By way of another example, a static global defectivity limit applied to net production numbers may include generating defectivity scores for a training population, removing dies that fail electrical testing from the population, identifying a value of the defectivity score that separates the 1% most defective of dies in this reduced population from the remainder of this population, and using this value of the defectivity score as the static global defectivity limit to identify outlier dies to be inked off for future populations.

In another embodiment, the method 600 includes a step 604 of applying the static global defectivity limit to the run-time population. In another embodiment, the method 600 includes a step 606 of identifying a first set of outlier dies from a run-time population as the dies in the run-time population that do not pass the static global defectivity limit. In this way, the first set of outlier dies may be identified without determining defectivity scores for the dies in the run-time population.

In another embodiment, the method 600 includes a step 608 of generating inspection data for dies in the run-time population that pass the static global defectivity limit. In another embodiment, the method 600 includes a step 610 of determining a dynamic defectivity limit based on the inspection data from the dies in the run-time population that pass the static global defectivity limit. In this way, the dynamic defectivity limit may be generated by, but is not required to be generated by, applying steps 308-312 illustrated in FIG. 3B to the portion of the run-time population that passes the static global defectivity limit.

In another embodiment, the method 600 includes a step 612 of applying the dynamic defectivity limit to the dies in the run-time population that pass the static global defectivity limit. In another embodiment, the method 600 includes a step 614 of identifying a second set of outlier dies that fail the dynamic defectivity limit. In another embodiment, the method 600 includes a step 616 of isolating (e.g., inking) the first and second sets of outlier dies. The first and second sets of outlier dies may then be subjected to further testing and/or removed from a distribution supply. Further, the steps of 604-616 in FIG. 6 may be repeated for any number of run-time populations.

It is additionally contemplated herein that the steps of determining the static and dynamic defectivity limits (e.g., step 602 and step 610 in FIG. 6) may be performed using the same or different weighted defectivity models. In one embodiment, a common weighted defectivity model is applied to both a training population to determine the static defectivity limit (e.g., step 602) and also to the run-time population to determine the dynamic defectivity limit. In this way, defects in both the training and run-time populations may be weighted in the same way. In another embodiment, separate weighted defectivity models are applied to a training population and a run-time population or between different run-time populations. For instance, a particular weighting scheme may be utilized to identify defects through a global defectivity limit such as, but not limited to, a weighting scheme designed to identify killer defects. Subsequently, one or more different weighting schemes may be applied to identify more subtle outliers in the run-time population. In another instance, the weighted defectivity model used in a current run-time population may be updated through feedback from one or more previous run-time populations.

Referring again to the step 312 in FIG. 3B, in another embodiment, determining the set of outlier dies based on the defectivity scores of the dies in the population includes identifying spatial signatures of defects based on the defectivity scores, where at least some of the set of outlier dies are identified based on proximity to other dies having spatial defectivity patterns that span multiple dies. Put another way, determining the set of outlier dies may include defect-guided G-PAT techniques. Further, in some embodiments, an analysis of spatial defect signatures may include defectivity scores for dies across a sample 104 as well as additional reliability determinations such as, but not limited to, electrical test results (e.g., generated by an electrical test tool 108).

Figure 7:
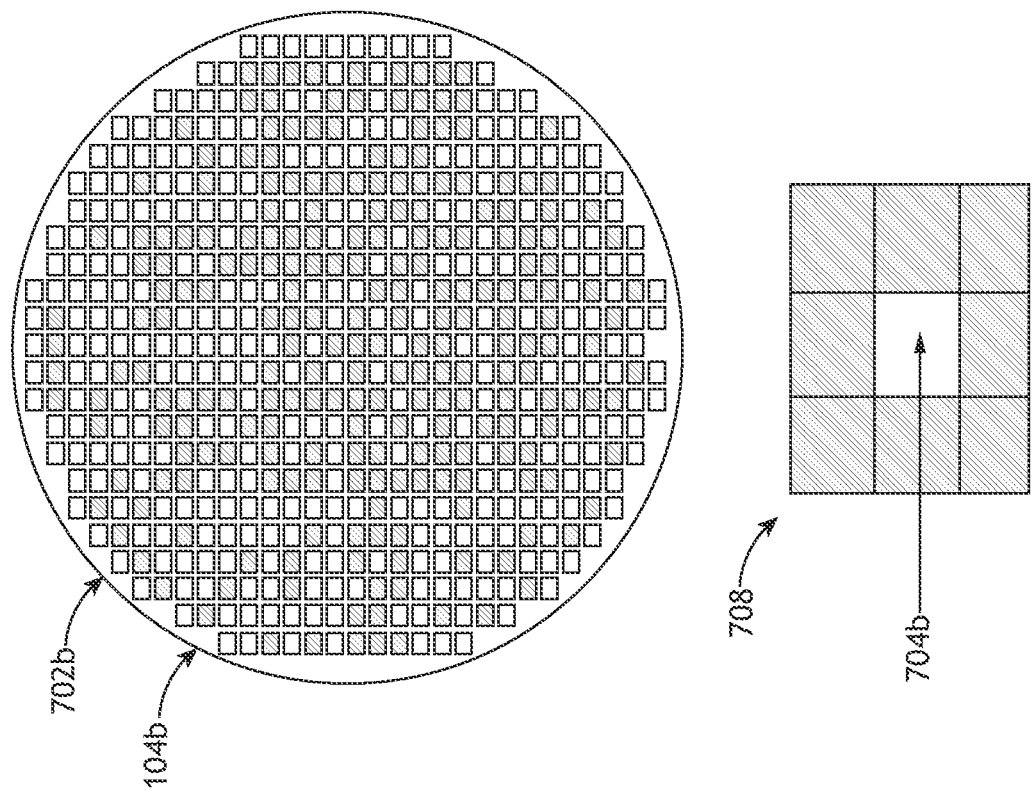
FIG. 7 includes die maps illustrating general principles of G-PAT analysis, in accordance with one or more embodiments of the present disclosure.
Figure 7:
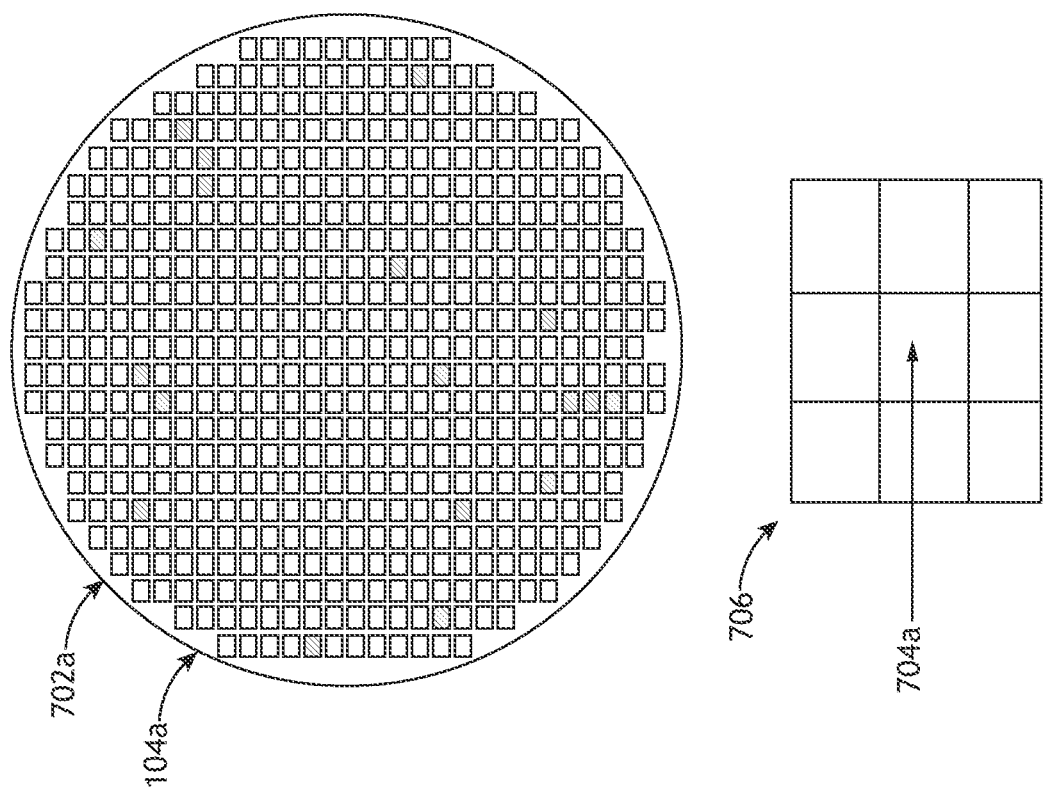

FIG. 7 includes die maps illustrating general principles of G-PAT analysis, in accordance with one or more embodiments of the present disclosure. In particular, FIG. 7 includes a first die map 702*a* of a first sample 104*a* and a second die map 702*b* of a second sample 104*b*, where failed dies are illustrated as hatched and acceptable dies are illustrated as open. For example, in a traditional G-PAT analysis, the hatched failed dies may be dies that have failed an electrical test.

A guiding principle of a G-PAT analysis is that supposedly-good dies (e.g., dies that pass an electrical test), but are in a cluster of failed dies (e.g., dies that fail an electrical test) may nonetheless have a statistically higher probability of early-life failures than other supposedly-good dies on the sample 104. Such a die is deemed to be a "good die in a bad neighborhood" (GDBN) and may be identified as an outlier in a G-PAT analysis. For example, the die 704*a* on the first sample 104*a* and illustrated in the insert 706 is a supposedly-good die surrounded by other supposedly-good dies, whereas the die 704*b* on the second sample 104*b* and illustrated in the insert 708 is a supposedly-good die surrounded by failed dies. Accordingly, a G-PAT analysis may identify the die 704*b* as an outlier die to be inked off.

It is contemplated herein that G-PAT methodologies may be guided by in-line defect data such as, but not limited to, defectivity scores as described throughout the present disclosure.

For example, the definition of a failed die in a G-PAT analysis may extend to dies that pass an electrical test, but have a defectivity score above a selected threshold. For instance, as described previously herein, I-PAT methodologies may be utilized to identify killer defects in both testable or untestable areas that may result in actual or predicted operational failures. In another instance, a defective die in a G-PAT analysis may include dies that are identified as outliers based on any selected weighted defectivity model (e.g., as described with respect to steps 308-312 of FIG. 3B above).

By way of another example, the concept of a failed die in a G-PAT analysis need not be binary. Rather, the defectivity score of a die may represent a non-binary indicator of reliability that may be included in spatial G-PAT analysis.

By way of another example, defectivity data may limit or constrain the scope of dies that are susceptible to being inked off through a G-PAT analysis. For example, a typical G-PAT analysis may ink off a die if it is adjacent to a selected number of failed die (e.g., 2 or more failed die). However, this type of analysis is highly susceptible to errors (e.g., overkill or underkill) and may not be suitable for applications requiring strict reliability standards. For instance, in the case of a sample 104 including a scratch extending across multiple dies, it may be the case that several die in a central or more severe portion of the scratch signature fail electrical tests and are identified as failed dies. However, a typical G-PAT analysis may fail to identify dies across the entire scratch signature (e.g., underkill) and may further mistakenly ink off dies proximate to the failed dies but not within the scratch signature and thus not likely to fail for the same reasons as the scratched dies (e.g., overkill).

In some embodiments, a spatial pattern of defects or failure dies (considering the broader definition of failed dies provided herein) may constrain the identification of outlier dies. For example, instead of inking all dies proximate to a selected number of failed dies, only dies associated with the spatial pattern of defects may be considered as outlier dies. Continuing the example of a scratch signature above, embodiments of the present disclosure may identify dies as outliers based on whether they are a part of a spatial defect signature rather than merely considering a number of adjacent failed dies.

Figure 3C:
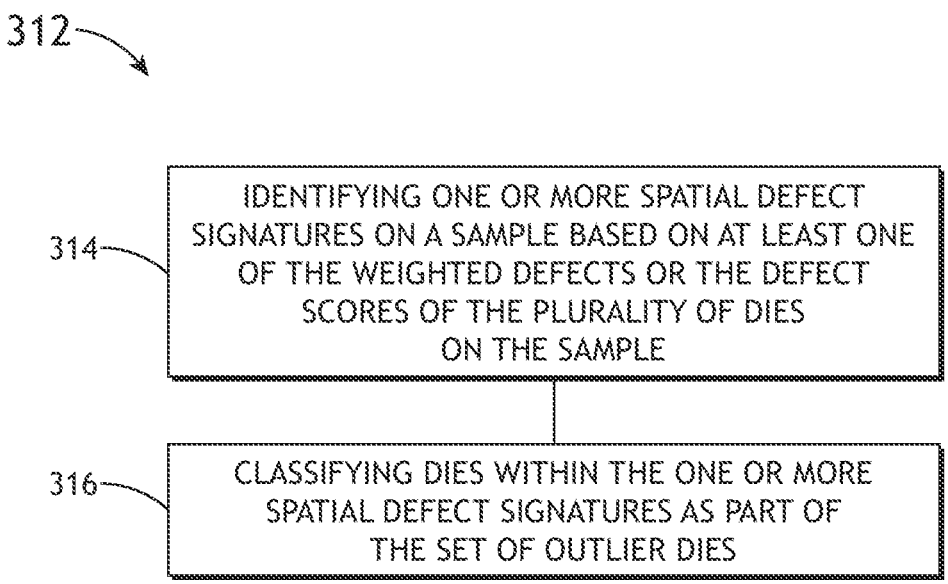
FIG. 3C is a flow diagram illustrating steps associated with determining the set of outlier dies based on the defectivity scores of the dies in the population, which includes identifying spatial signatures of defects based on the defectivity scores as part of a defect-guided G-PAT methodology, in accordance with one or more embodiments of the present disclosure.

FIG. 3C is a flow diagram illustrating steps (or sub-steps) associated with determining the set of outlier dies based on the defectivity scores of the dies in the population which includes identifying spatial signatures of defects based on the defectivity scores (e.g., step 312 of the method 300) as part of a defect-guided G-PAT methodology, in accordance with one or more embodiments of the present disclosure. FIG. 3C shares several steps (or sub-steps) with FIG. 3B such that the descriptions associated with FIG. 3B may be applied to FIG. 3C as well.

In one embodiment, the step 312 includes a step 314 of identifying one or more spatial defect signatures on a sample 104 based on at least one of the weighted defects or the defect scores of the plurality of dies on the sample 104. In another embodiment, the step 312 includes a step 316 of classifying dies within the one or more spatial defect signatures as part of the set of outlier dies.

It is contemplated herein that the step 314 of identifying spatial defect signatures may be performed in multiple ways.

In one embodiment, a spatial defect signature is identified at least in part from the defectivity scores (e.g., generated in step 310). For example, a die map may be generated in which the color or other identifiable characteristic of a die is representative of the defectivity score for that die. In this way, spatial defect signatures may be identified with die-level resolution.

In another embodiment, a spatial defect signature is identified at least in part from spatial distributions of weighted defects (e.g., defects weighted in step 308). In this way, spatial defect signatures may be identified with sub-die resolution based on the particular distribution of defects across the sample 104. For example, a die map including the stacked weighted defects from various layers of interest may be generated to provide a graphical representation of the defects across the sample. For instance, defects with different weights may be represented with different colors, symbols, or other differentiated characteristics. In another instance, all defects having at least a certain weight may be provided in the die map. Further, the use of the weighted defects allows for emphasis on defects with a higher likelihood of impacting reliability and for the filtering out of nuisance defects (e.g., which may be weighted to zero to exclude them from further analysis).

In another embodiment, a spatial defect signature is identified at least in part by locations of failed dies. As described previously herein, failed dies may include dies that have failed one or more electrical tests (e.g., performed by an electrical test tool 108), dies identified as having killer defects in testable or otherwise untestable areas of the dies, or a combination of the two.

Further, it is contemplated herein that spatial defect signatures may be identified in various ways within the spirit and scope of the present disclosure. Further, spatial defect signatures may be identified using any combination of statistical or image-based recognition techniques.

In one embodiment, a die map including any combination of failed dies, defectivity scores, and locations of weighted defects (e.g., locations of defects that are not weighted to zero and classified as nuisance defects) may be provided as an image to an image-based spatial signature recognition algorithm. Further, an image-based spatial signature algorithm may include any type of spatial signature recognition algorithm known in the art including, but not limited to, rule-based techniques, pattern-matching techniques, or machine-learning techniques. For example, rule-based techniques may identify defect clusters (e.g., defects within a certain region on the sample) or defects that lie along a defined signature (e.g., a line, an arc, a ring, or the like). By way of another example, pattern-matching techniques may analyze defect distributions for known defectivity signatures (e.g., spirals, arcs, cut-line signatures, or the like). Further, in some embodiments, layer-specific information may be utilized to facilitate pattern identification of spatial defect signatures. For instance, it may be the case that certain layers have known wafer-level signatures common to the fabrication steps associated with that layer. As an illustration, swirl-shaped or curved defect signatures may be common for layers in which chemical-mechanical-planarization (CMP) or spin-on film deposition are utilized. In this way, the techniques used for spatial defect signature recognition may vary by sample layer.

In another embodiment, spatial defect signatures are identified using statistical outlier detection algorithms. In another embodiment, spatial defect signatures are identified at least in part through user input or user-guided input. For example, a die map may be presented to a user for identification of spatial patterns, which may be inputted using the user interface 116. By way of another example, a user may be presented with the results of algorithmically-identified spatial patterns for review and/or modification.

Referring now to FIGS. 8A-9C, defect-guided G-PAT is described in greater detail in accordance with one or more embodiments of the present disclosure.

Figure 8A:
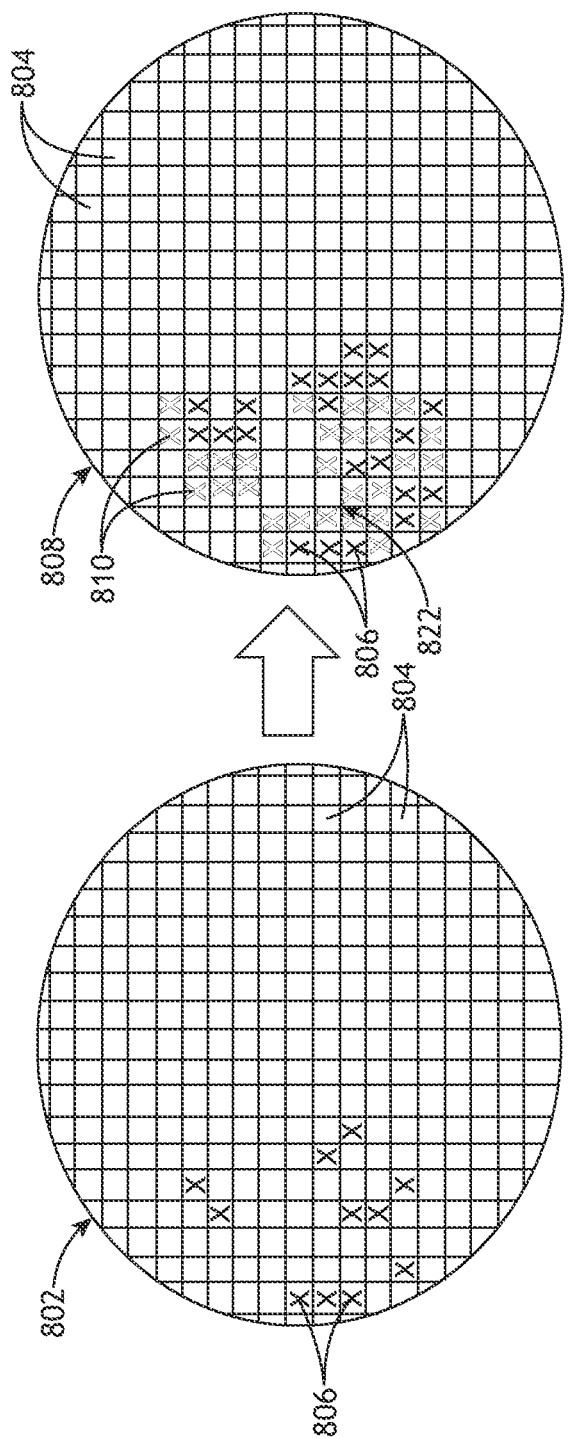
FIG. 8A is a schematic illustration of identifying outlier dies with a standalone G-PAT technique, in accordance with one or more embodiments of the present disclosure.
Figure 8B:
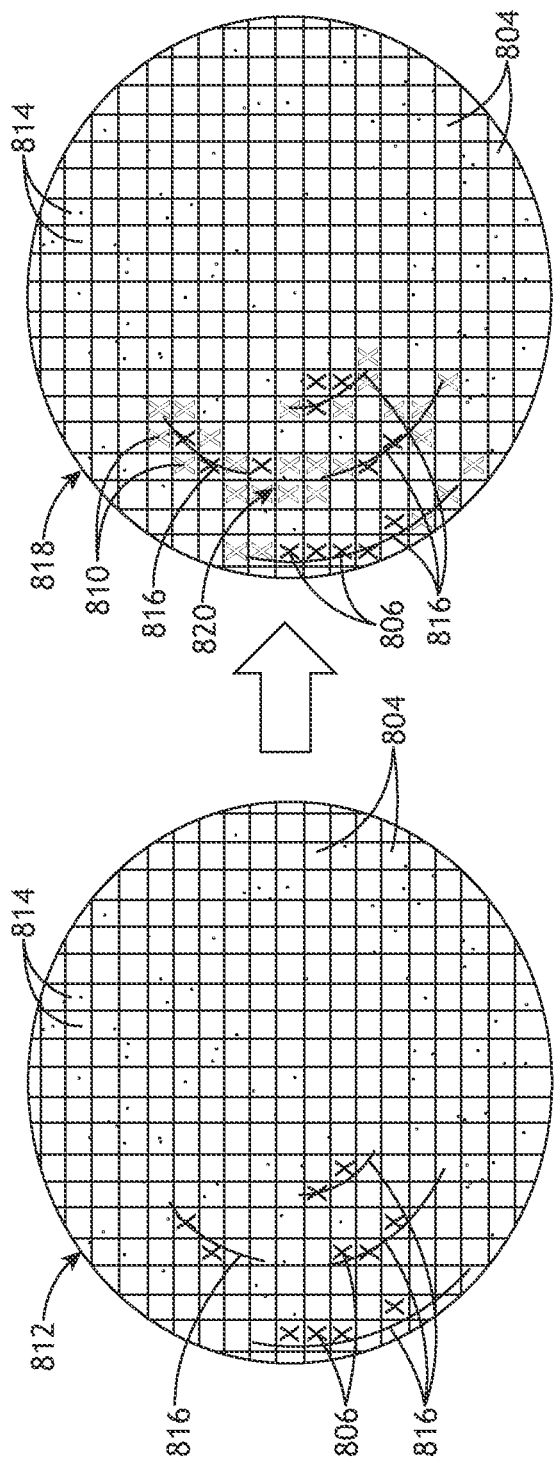
FIG. 8B is a schematic illustration of identifying outlier dies with a defect-guided G-PAT technique, in accordance with one or more embodiments of the present disclosure.

FIGS. 8A-8B conceptually illustrate the uses of defects to improve a traditional G-PAT methodology based failed dies identified by failure of electrical testing. FIG. 8A is a schematic illustration of identifying outlier dies with a standalone G-PAT technique in accordance with one or more embodiments of the present disclosure. FIG. 8A includes a first top view 802 of a sample 104 with many dies 804 distributed across the sample 104, where dies that fail electrical testing are identified as failed dies 806 and are illustrated with a closed (solid) "X." FIG. 8A further includes a second top view 808 of the sample 104 in which dies proximate to the failed dies 806, marked with an open "X," are identified as outlier dies 810 by a standalone G-PAT technique and inked off. In this simulation, the traditional G-PAT identifies all dies adjacent to the failed dies 806 as the outlier dies 810.

FIG. 8B is a schematic illustration of identifying outlier dies with a defect-guided G-PAT technique in accordance with one or more embodiments of the present disclosure. FIG. 8B includes a second top view 812 of the sample 104, which is similar to the first top view 802 in FIG. 8A, but further including an overlay of weighted defects 814 as well as an overlay of spatial defect signatures 816 associated with four scratches on the sample 104. In one embodiment, the spatial defect signatures 816 associated with the scratches are identified. For example, the spatial defect signatures 816 may be identified based on any combination of a spatial pattern of the failed dies 806, a spatial pattern of the weighted defects 814, or a spatial pattern of outlier dies identified based on defectivity scores.

FIG. 8B further includes a second top view 818 of the sample 104 in which outlier dies 810 identified using defect-guided G-PAT are marked with an open "X." In FIG. 8B, the failed dies 806 are associated with larger spatial defect signatures 816 associated with curved scratches across the sample 104 that are identifiable at least in part by the weighted defects 814 and/or the associated defectivity scores. In this way, the set of outlier dies 810 may include dies more precisely related to the root cause associated with the spatial defect signatures 816 (e.g., the scratches). For example, FIG. 8B illustrates the identification of a group 820 of outlier dies 810 between two sets of failed dies 806 that are associated with a common scratch path that is not identified in the traditional G-PAT methodology of FIG. 8A. In this way, the defect-guided G-PAT reduced underkill by identifying dies with likely reliability issues. By way of another example, the set of outlier dies 810 does not include dies 822 (shown in FIG. 8A) located radially between the spatial defect signatures 816 of the scratches since these dies are likely not impacted by the scratches. Given that these dies were identified as outlier dies 810 in FIG. 8A, the defect-guided approach of FIG. 8B reduced overkill.

Figure 9A:
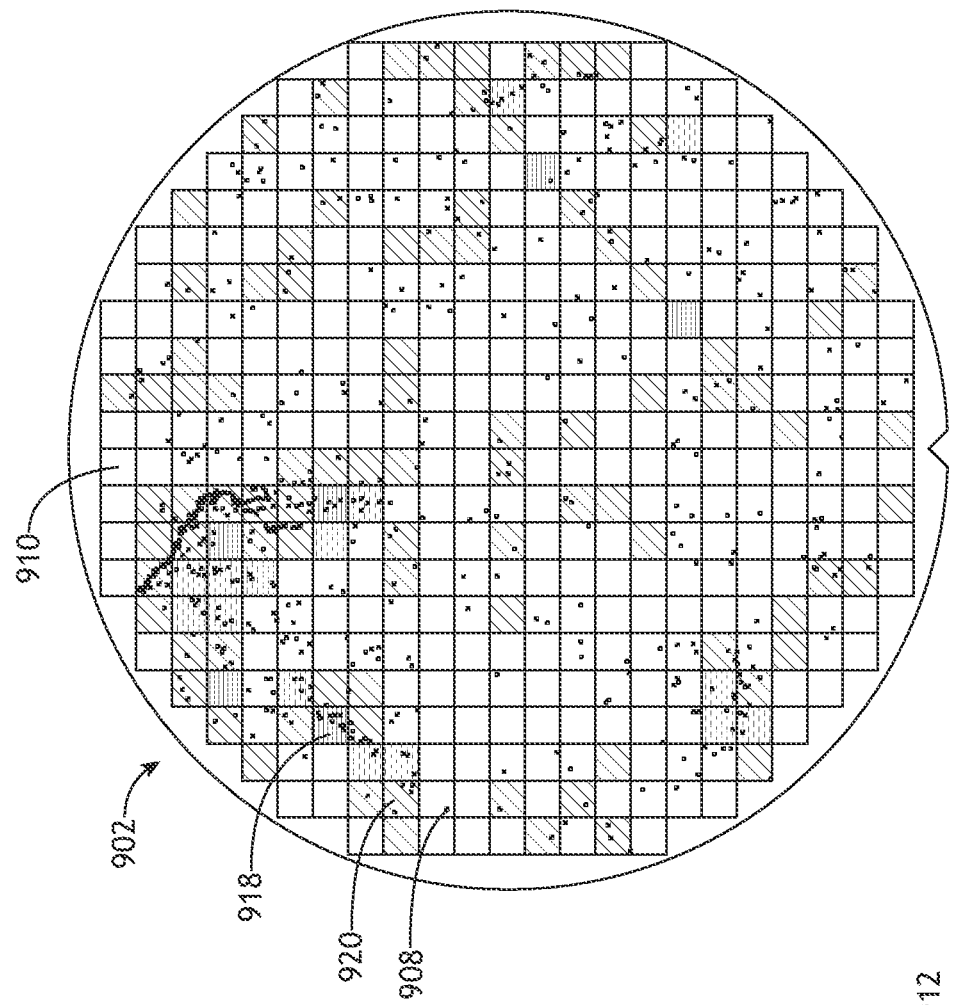

FIGS. 9A-9C illustrate experimental implementations of defect-guided G-PAT methodologies on three example dies, in accordance with one or more embodiments of the present disclosure. FIGS. 9A-9C include die maps 902, 904, 906 including weighted defects 908 (e.g., defects deemed as non-nuisance defects based on a weighted defectivity model) across dies 910 on a sample 104. Various die-level information may also be included in a die map. For example, e-test failed dies 912 that fail an electrical test are illustrated as solid diagonally hatched from bottom left to top right. By way of another example, traditional G-PAT outlier dies 914 identified solely based on the application of G-PAT techniques to the e-test failed dies 912 are illustrated as horizontally-hatched. By way of another example, the defect-guided G-PAT outlier dies 916 identified based on G-PAT methodologies guided by the weighted defects 908 are illustrated as dash-hashed. Additionally, although not shown, die maps such as those illustrated in FIGS. 9A-9C may include defectivity scores. For instance, dies may be colored, hatched, or otherwise designated based on the defectivity scores.

In one embodiment, die maps such as, but not limited to, those illustrated in FIGS. 9A-9C are provided as inputs for the detection of spatial defect signatures. In this way, the spatial defect signatures may identify groups of defects associated with common root causes, which may then be used to guide a G-PAT methodology for determining outlier dies associated with these spatial defect signatures. For example, the spatial defect signatures may be, but are not required to be, combined with electrical test data (e.g., the e-test failed dies 912) for the identification of outlier dies that may pass electrical testing but may nonetheless have a higher likelihood of early-life failure (e.g., have latent defects) than other dies in the population.

As illustrated in FIGS. 9A-9C, the traditional G-PAT technique based solely on e-test failed dies 912 may generally fail to capture significant at-risk dies associated with spatial defect signature. For example, the traditional G-PAT outlier dies 914 properly include some dies associated with defect clusters 918 that are largely surrounded by failed dies 806 or are near edges. However, the traditional G-PAT technique often failed to capture the full extent of the defect clusters 918. Further, the traditional G-PAT technique often failed to capture dies located along long linear or curved scratch patterns 920 that span multiple dies, particularly when the scratch patterns span across dies in a diagonal direction. In contrast, these dies were captured using a defect-guided approach as disclosed herein and are included in the set of defect-guided G-PAT outlier dies 916.

In contrast, such dies are more reliably captured by the defect-guided G-PAT approach and are included in the defect-guided G-PAT outlier dies 916. It is noted herein that the defect-guided G-PAT outlier dies 916 in FIGS. 9A-9C only illustrate outlier dies that are not identified as traditional G-PAT outlier dies 914 by the traditional G-PAT technique in order to clearly differentiate the advantages of defect-guided approaches. Although not shown in FIGS. 9A-9C, the defect-guided G-PAT outlier dies 916 may also include at least some, but not necessarily all, of the traditional G-PAT outlier dies 914 as generally described with respect to FIGS. 8A and 8B.

Referring now generally to FIGS. 3A and 3B, numerous techniques for identifying a set of outlier dies based on weighted defects (e.g., the step 304 of the method 300) have been disclosed herein. It is also to be understood that the specific examples and illustrations provided herein are provided solely for illustrative purposes and should not be interpreted as limiting on the present disclosure.

It is further contemplated herein that different techniques may have different advantages and disadvantages related to any number of factors including sensitivity to particular defects, throughput, or computational requirements.

In one embodiment, the method 300 may including iterating the step 304 using multiple different techniques, where each iteration provides a different candidate set of outlier dies. Then, the method 300 may further include a step of identifying an output set of outlier dies based on the candidate sets. In this regard, the output set of outlier dies may be generated using an ensemble approach to take advantage of the various strengths of different approaches. Further, an ensemble approach may provide greater confidence in the selection of outlier dies, which may simultaneously reduce underkill by capturing a wide variety of defect types and classes through the different techniques, reducing overkill overall by limiting the impact of overkill associated with any one technique, and improving the reliability of the production line overall by accurately identifying high-risk die.

Further, the output set of outlier dies may be generated based on the candidate sets using a variety of approaches. For example, a particular die may be classified in the output set of outlier dies if the particular die is identified in a selected number of candidate sets of outlier dies (e.g., two or more, three or more, or the like). Using this approach identification of a particular die with multiple techniques may increase the confidence of the classification. Similarly, a die identified by one (or a relatively low number) of techniques may have relatively lower risk. By way of another example, the various techniques themselves (and the associated candidate sets of defects) may be weighted in a final determination. For instance, in the case that particular techniques are well suited for the identification of particular defect types (e.g., killer defects, scratch defects, or the like), dies identified by that technique may be given a higher weight to facilitate accurate detection of these defect types.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An inspection system comprising:
   a controller communicatively coupled to one or more in-line sample analysis tools, the controller including one or more processors configured to execute program instructions causing the one or more processors to:
   identify defects in a population of dies based on data received from at least one of the one or more in-line sample analysis tools;
   assign weights to the identified defects using a weighted defectivity model, wherein the weighted defectivity model assigns weights to the identified defects indicative of predicted impact of the identified defects on reliability of the dies;
   generate defectivity scores for the dies in the population by aggregating the weighted defects in the respective dies in the population; and
   determine a set of outlier dies based on the defectivity scores for the dies in the population, wherein at least some of the set of outlier dies are isolated from the population.

2. The inspection system of claim 1, wherein the one or more in-line sample analysis tools comprise:
   at least one of an inspection tool or a metrology tool.

3. The inspection system of claim 1, wherein isolating at least some of the set of outlier dies from the population comprises:
   removing the isolated dies from a distribution supply.

4. The inspection system of claim 1, wherein isolating at least some of the set of outlier dies from the population comprises:
   subjecting the isolated dies to one or more performance tests.

5. The inspection system of claim 1, wherein isolating at least some of the set of outlier dies from the population comprises:
   providing at least the defectivity scores of the set of outlier dies to a user for review.

6. The inspection system of claim 5, wherein isolating at least some of the outlier dies from the population further comprises:
   providing the defectivity scores of a remainder of the population to the user for review.

7. The inspection system of claim 1, wherein the population comprises:

at least one of dies in a sample, dies in multiple samples in a lot, or dies in multiple samples in multiple lots.

8. The inspection system of claim 1, wherein assigning weights to the identified defects using the weighted defectivity model comprises:
assigning weights to the identified defects using a weighted defectivity model based on one or more measured characteristics of the identified defects.

9. The inspection system of claim 8, wherein the one or more measured characteristics of the identified defects comprise:
at least one of deviations from a design specification, defect type, defect class, or defect severity.

10. The inspection system of claim 1, wherein assigning weights to the identified defects using a weighted defectivity model comprises:
assigning weights to the identified defects using a weighted defectivity model based on relationships between a particular defect and one or more additional identified defects.

11. The inspection system of claim 10, wherein the relationships between the particular defect and the one or more additional identified defects comprise:
at least one of defect density on a particular layer, defect density in a particular location across multiple layers, or spatial defectivity patterns.

12. The inspection system of claim 1, wherein assigning weights to the identified defects using a weighted defectivity model comprises:
assigning weights to the identified defects using a weighted defectivity model based on measured characteristics of one or more layers surrounding the identified defects.

13. The inspection system of claim 12, wherein the measured characteristics of one or more layers surrounding the identified defects comprise:
at least one of layer thickness, layer composition, layer flatness, layer topography, layer resistivity, localized stress measurements, or critical dimension measurements of one or more patterned features surrounding the identified defects.

14. The inspection system of claim 1, wherein assigning weights to the identified defects using a weighted defectivity model comprises:
assigning weights to the identified defects using a weighted defectivity model based on location in one or more defined care areas.

15. The inspection system of claim 14, wherein at least one of the one or more care areas comprises:
one or more test escape areas untested by an electrical testing tool, wherein the weighted defectivity model assigns relatively high weights to defects in the one or more test escape areas to facilitate identification of defects in the one or more test escape areas.

16. The inspection system of claim 1, wherein assigning weights to the identified defects using a weighted defectivity model comprises:
assigning weights to the identified defects using a weighted defectivity model based on ground truth indicators of reliability issues through at least one of a library of defect attributes or a machine learning technique.

17. The inspection system of claim 1, wherein assigning weights to the identified defects using a weighted defectivity model comprises:
classifying the identified defects into a selected number of weighted classes.

18. The inspection system of claim 17, wherein the selected number of weighted classes includes three weighted classes.

19. The inspection system of claim 17, wherein at least one of the weighted classes includes killer defects predicted to cause at least one of immediate or early-life failures.

20. The inspection system of claim 17, wherein at least one of the weighted classes includes nuisance defects weighted to zero.

21. The inspection system of claim 1, wherein determining a set of outlier dies based on the defectivity scores for the dies in the population comprises:
sorting the dies in the population based on the defectivity scores; and
determining a cutoff value of the defectivity score separating the set of outlier dies from a remainder of the population based on the sorted defectivity scores.

22. The inspection system of claim 21, wherein determining a cutoff value of the defectivity score separating the set of outlier dies from a remainder of the population based on the sorted dies comprises:
generating an outlier chart plotting the sorted defectivity scores; and
determining the cutoff value of the defectivity score separating the set of outlier dies from a remainder of the population based on the outlier chart.

23. The inspection system of claim 1, wherein determining a set of outlier dies based on the defectivity scores for the dies in the population comprises:
classifying dies in the population having a defectivity score above a selected threshold into the set of outlier dies.

24. The inspection system of claim 23, wherein determining the set of outlier dies based on the defectivity scores for the dies in the population further comprises:
limiting the number of dies in the set of outlier dies based on an upper limit, wherein the upper limit is determined based on at least one of an economic limitation or a yield limitation.

25. The inspection system of claim 1, wherein determining a set of outlier dies based on the defectivity scores for the dies in the population comprises:
defining a global defectivity limit based on a training population of dies; and
classifying dies in the population having a defectivity score above the global defectivity limit into the set of outlier dies.

26. The inspection system of claim 25, further comprising:
defining a dynamic defectivity limit based on the population of dies that passes the global defectivity limit; and
further classifying dies in the population having a defectivity score above the dynamic defectivity limit into the set of outlier dies.

27. The inspection system of claim 1, wherein determining a set of outlier dies based on the defectivity scores for the dies in the population comprises:
generating a die map including at least one of the weighted defects or the defectivity scores associated with the dies in a sample of the population;
identifying one or more spatial defect signatures on the sample based on the at least one of the weighted defects or the defectivity scores associated with the dies in the sample; and
classifying defects within the one or more spatial defect signatures in the set of outlier dies.

28. The inspection system of claim 27, wherein the die map further includes failed dies that fail an electrical test, wherein identifying one or more spatial defect signatures on the sample comprises:
   identifying one or more spatial defect signatures on the sample based at least in part on the failed dies.

29. The inspection system of claim 1, wherein the population comprises:
   dies passing an electrical test.

30. The inspection system of claim 1, wherein the system further comprises:
   at least one of the one or more sample analysis tools.

31. An inspection method comprising:
   identifying defects in a population of dies based on inspection data received from one or more in-line sample analysis tools;
   assigning weights to the identified defects using a weighted defectivity model, wherein the weighted defectivity model assigns weights to the identified defects indicative of predicted impact of the identified defects on reliability of the dies;
   generating defectivity scores for the dies in the population by aggregating the weighted defects in the respective dies in the population; and
   determining a set of outlier dies based on the defectivity scores for the dies in the population, wherein at least some of the set of outlier dies are isolated from the population.

\* \* \* \* \*